United States Patent [19]
Dennison et al.

[11] Patent Number: 5,338,700
[45] Date of Patent: Aug. 16, 1994

[54] METHOD OF FORMING A BIT LINE OVER CAPACITOR ARRAY OF MEMORY CELLS

[75] Inventors: Charles H. Dennison; Aftab Ahmad, both of Boise, Id.

[73] Assignee: Micron Semiconductor, Inc., Boise, Id.

[21] Appl. No.: 47,668

[22] Filed: Apr. 14, 1993

[51] Int. Cl.$^5$ ............................................. H01L 21/72
[52] U.S. Cl. ...................... 437/60; 437/233; 437/919
[58] Field of Search ............ 437/47, 52, 60, 233, 437/919; 148/DIG. 14; 257/306

[56] References Cited

U.S. PATENT DOCUMENTS

| | | | |
|---|---|---|---|
| 4,855,801 | 7/1987 | Kuesters | 257/306 |
| 4,994,893 | 2/1991 | Ozaki et al. | 257/306 |
| 5,010,039 | 5/1991 | Ku et al. | 437/233 |
| 5,047,817 | 9/1991 | Wakamiya et al. | 257/306 |
| 5,166,090 | 11/1992 | Kim et al. | 437/233 |
| 5,206,183 | 4/1993 | Dennison | 437/60 |

FOREIGN PATENT DOCUMENTS 63-133565 6/1988 Japan .
1-100960 4/1989 Japan .
1-215060 8/1989 Japan .

OTHER PUBLICATIONS

Inoue et al., "A Spread Stacked Capacitor (SSC) Cell for 64 MBit DRAMs", IEDM 1989, pp. 31–34.
Ema et al. "3-Dimensional Stacked Capacitor Cell for 16M and 64M DRAMs", IEDM 1988, pp. 592–595.
Hayashide et al., "Fabrication of Storage Capacitance–Enhanced Capacitors with a Rough Electrode," Ext. Abs. of 22nd Conf. on SSDM 1990, pp. 869–872.
Miyagawa et al., "Two stip Deposited Rugged Surface Storagenode and Self Aligned Bitline-Contact Penetrating Cellplate for 64Mb DRAM STC Cell," pp. 9–10, (no date).

Primary Examiner—Brian E. Hearn
Assistant Examiner—Chandra Chaudhari
Attorney, Agent, or Firm—Wells, St. John, Roberts, Gregory & Matkin

[57] ABSTRACT

A method of forming a bit line over capacitor array of memory cells includes providing first conductive material pillars within first contact openings downwardly to active (source/drain) areas for ultimate connection with bit lines. A covering layer of insulating material is provided over the first pillars, and contact openings provided therethrough to electrically connect with other active (source/drain) areas for formation of capacitors. Capacitors are then provided within the capacitor contact openings. An overlying layer of insulating material is then provided over the covering layer of insulating material and over the capacitors. Bit line contact openings are then provided through the overlying layer and the covering layer to the first pillar upper surfaces. Then, a digit line layer of conductive material is provided atop the wafer and within the bit line contact openings, the digit line layer electrically connecting with the first pillar upper surfaces.

33 Claims, 20 Drawing Sheets

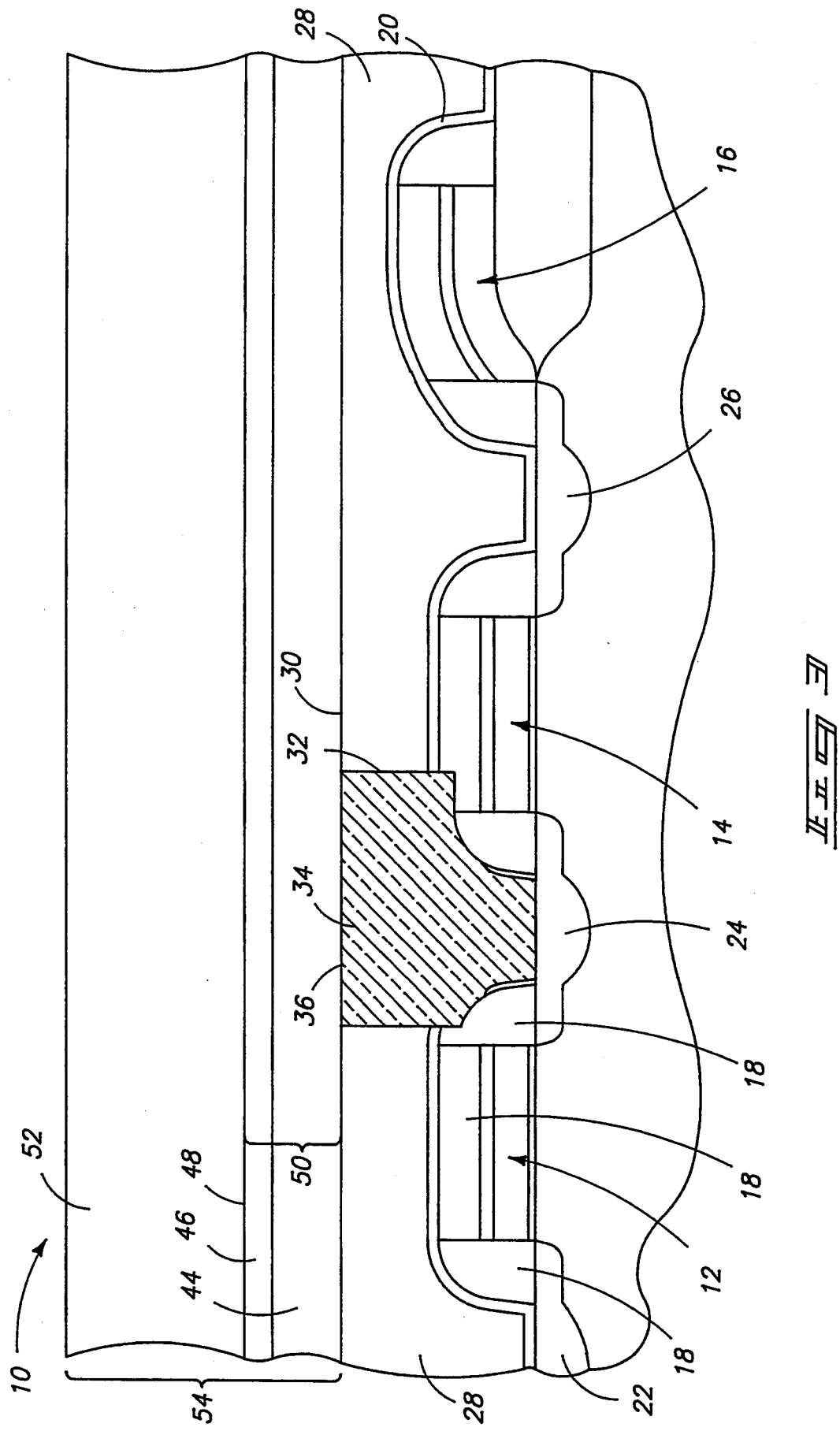

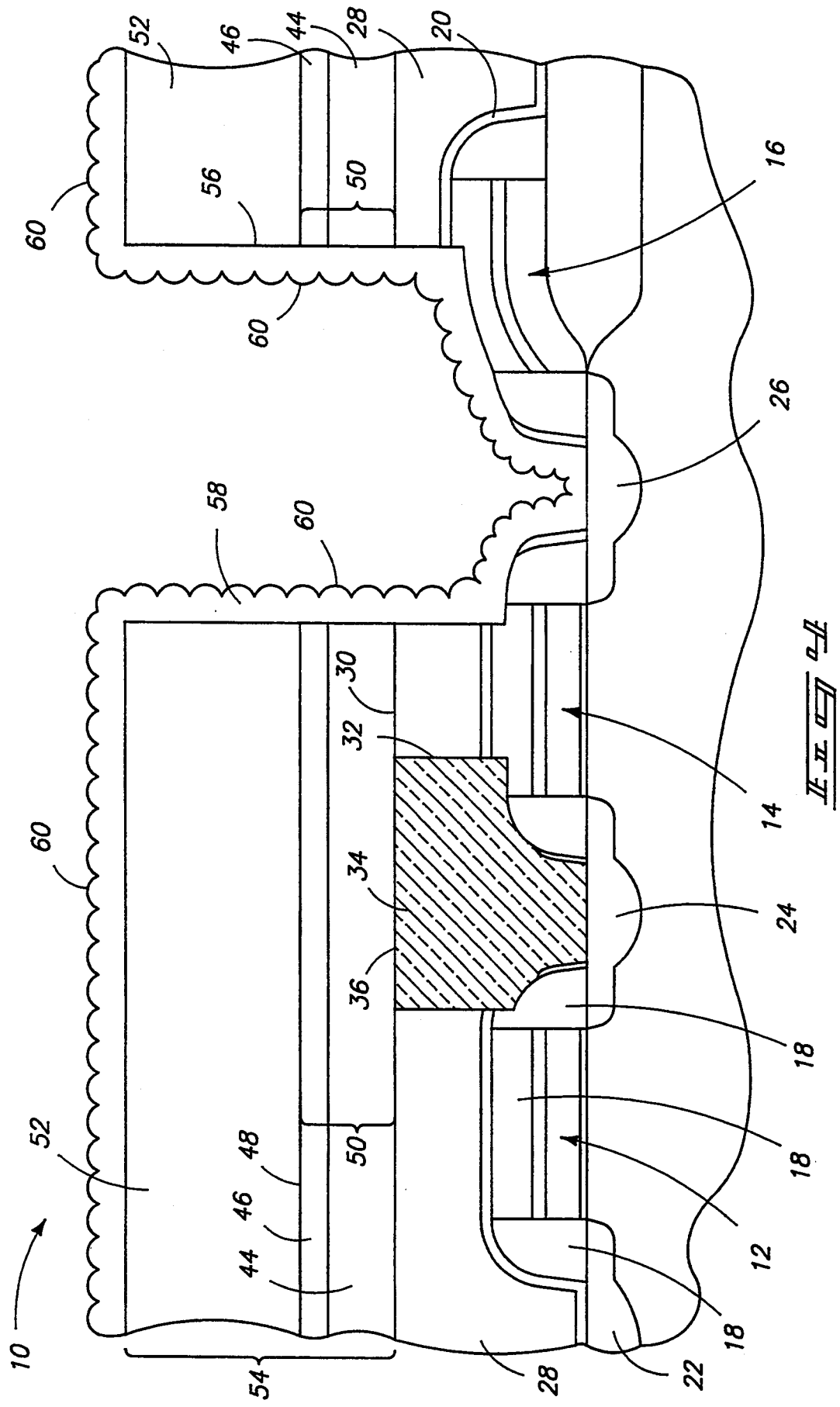

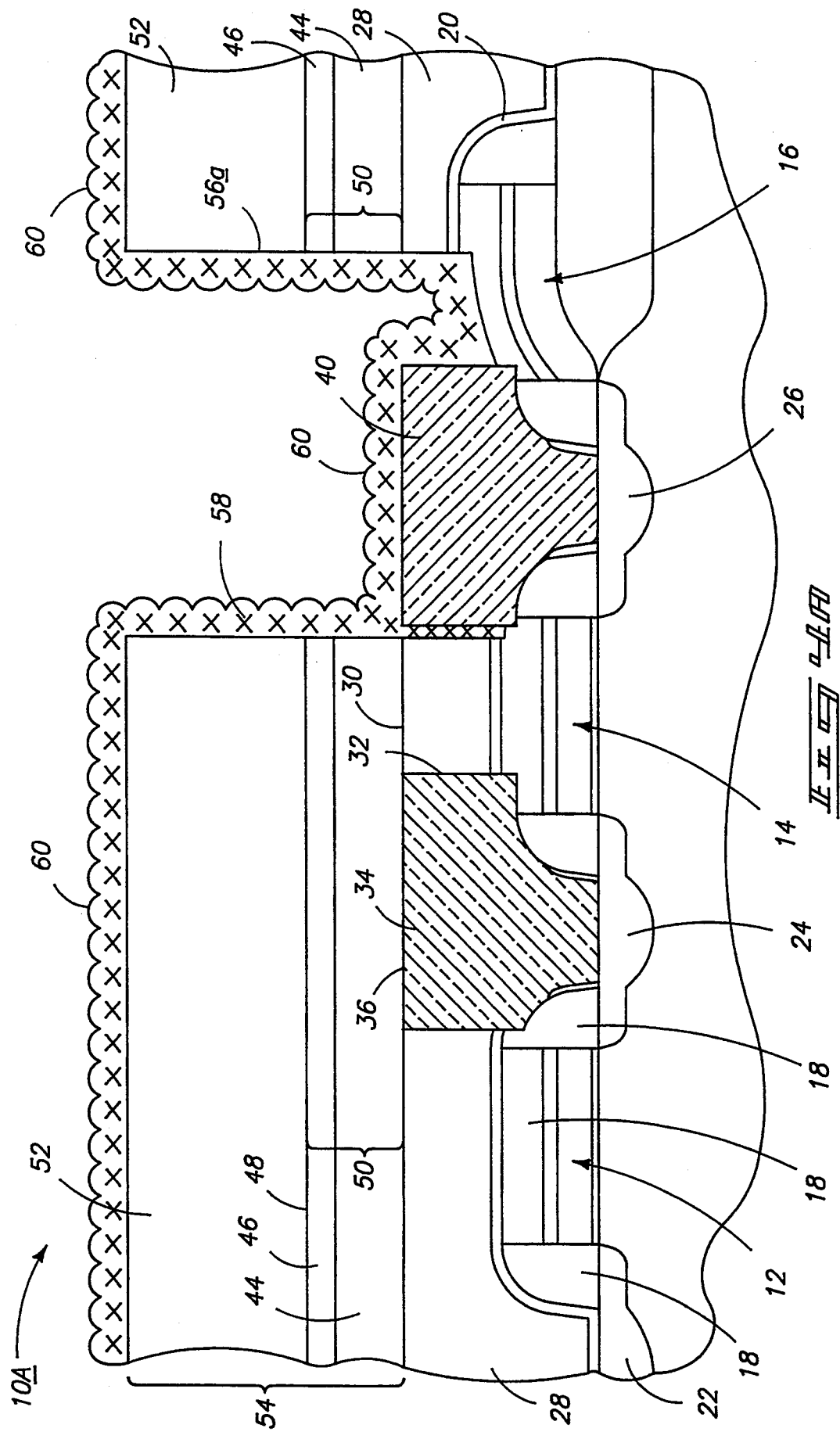

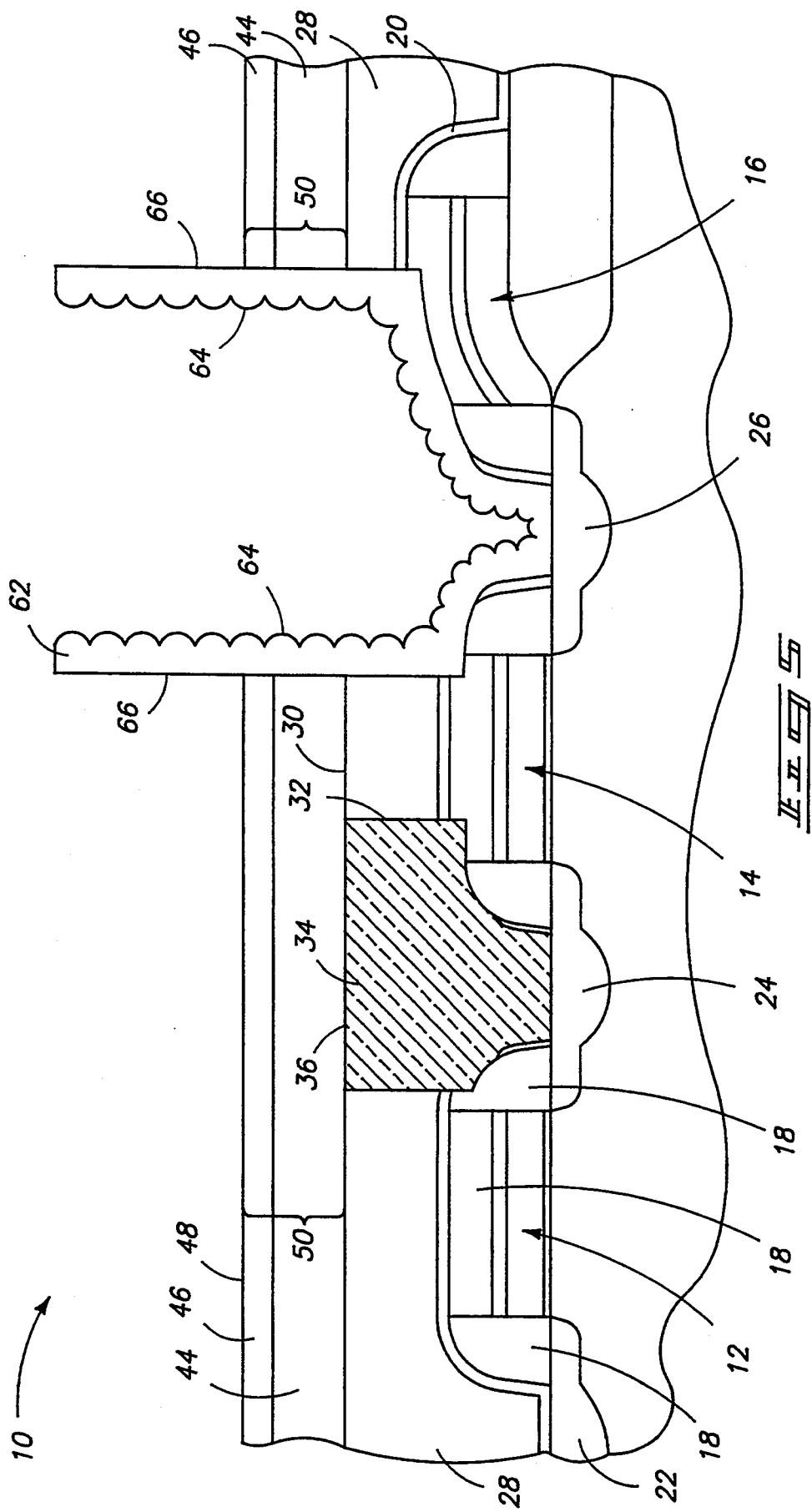

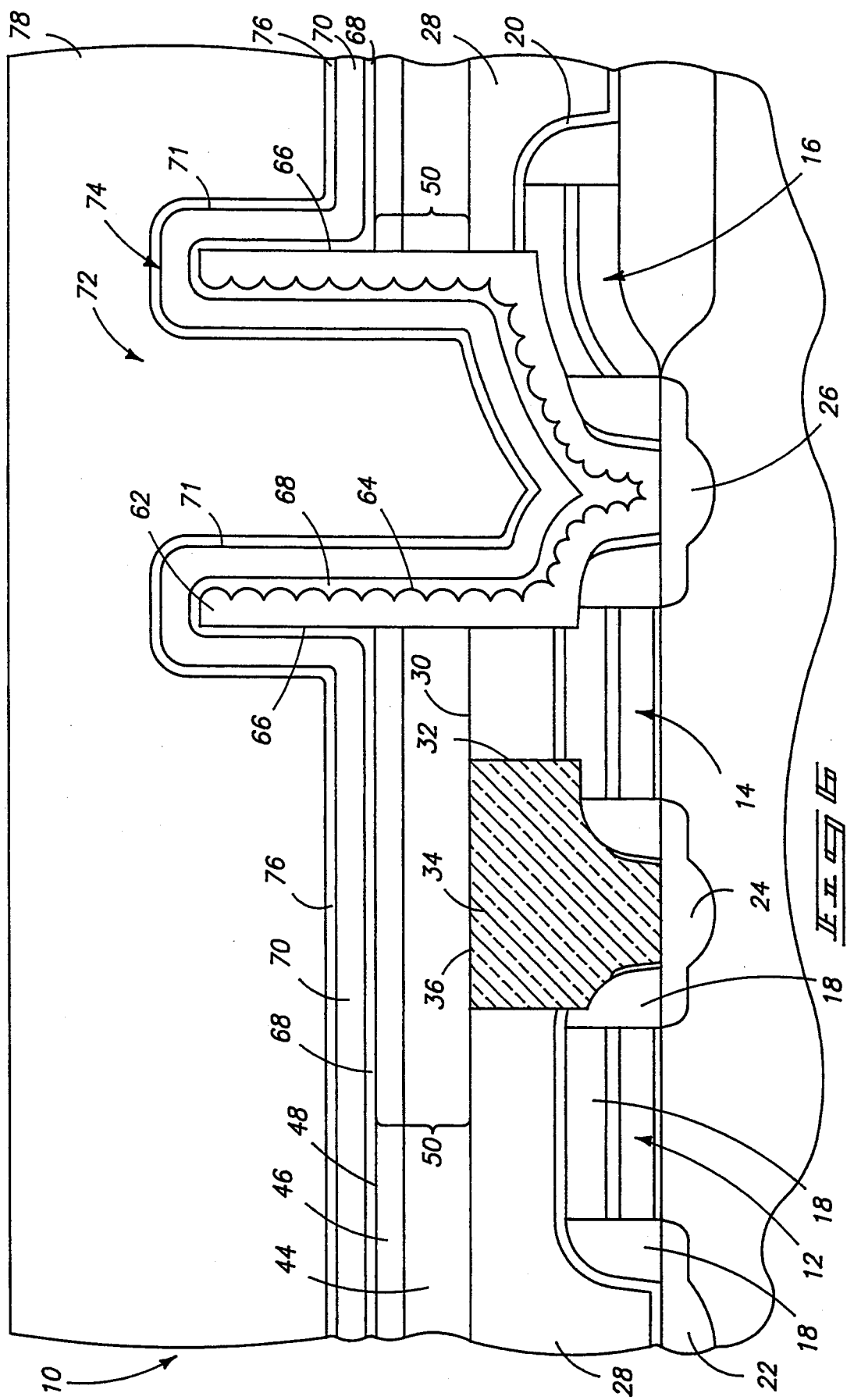

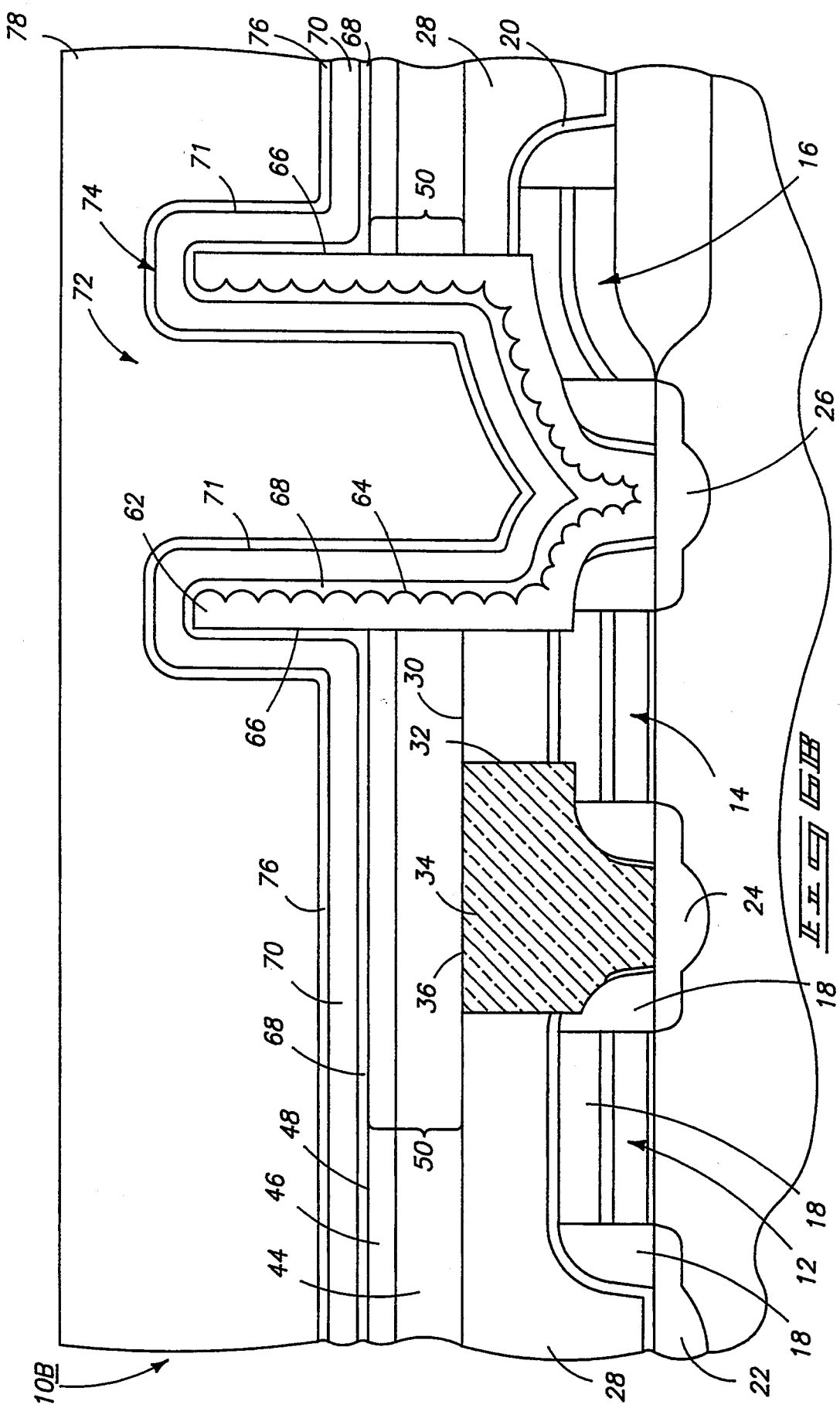

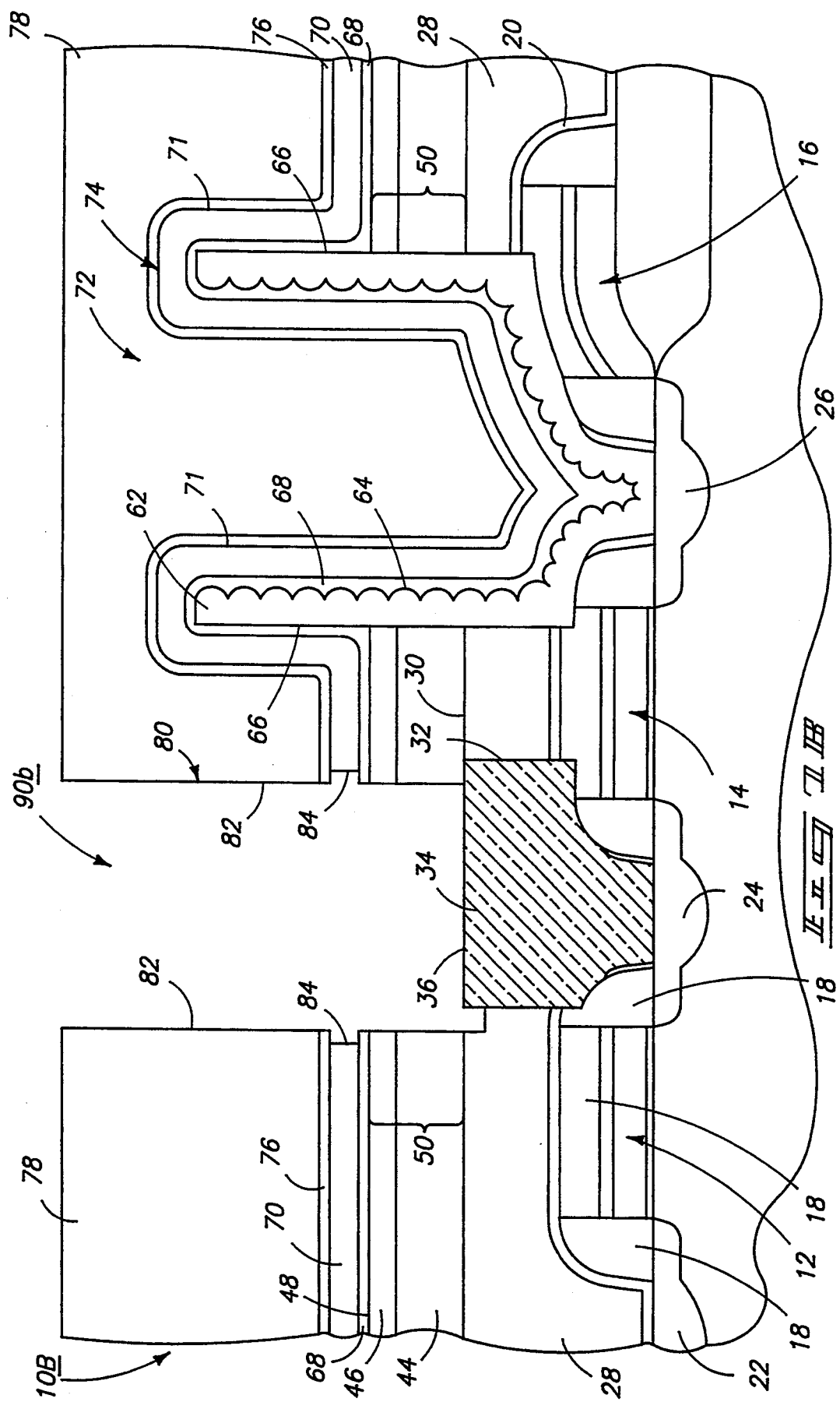

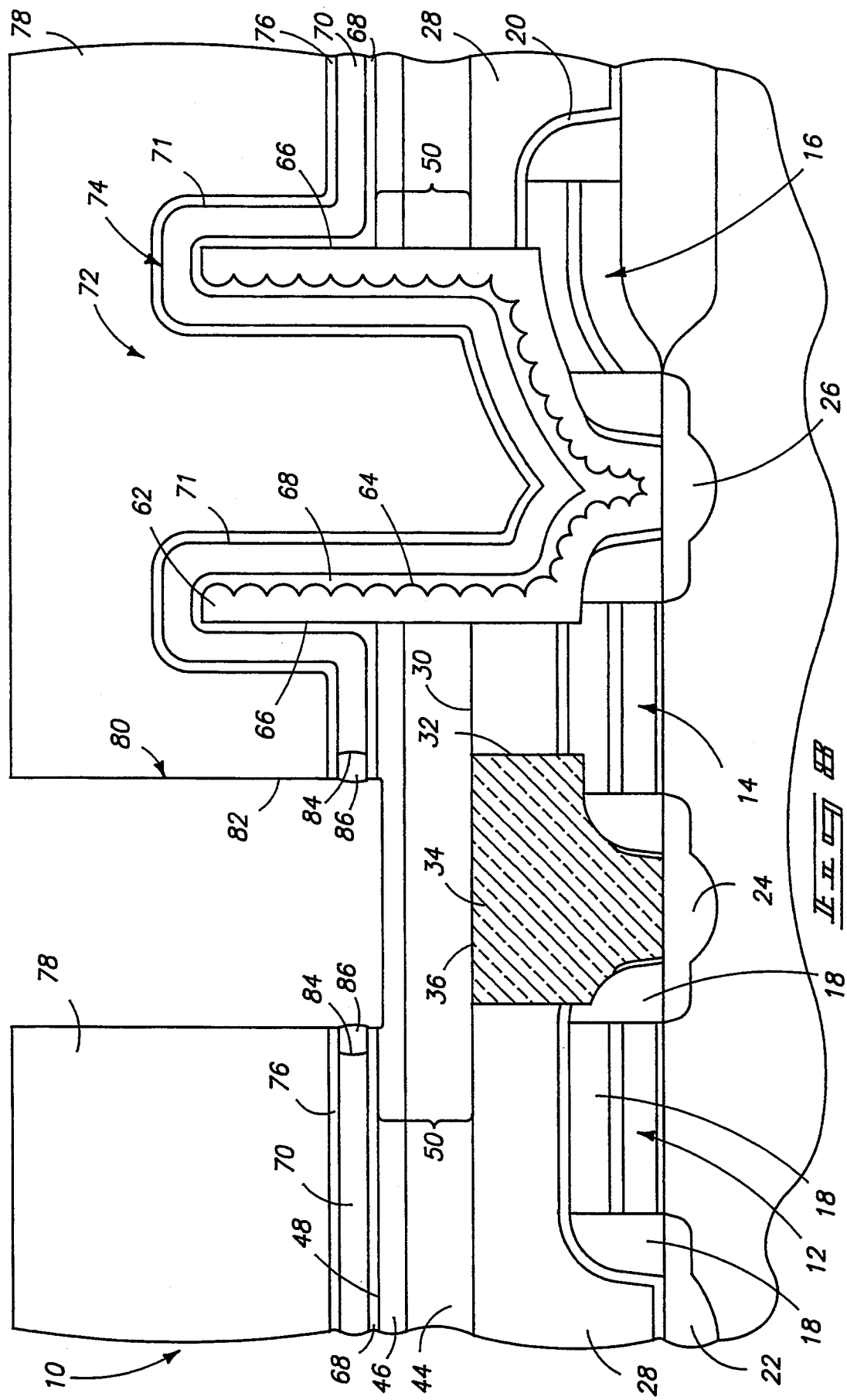

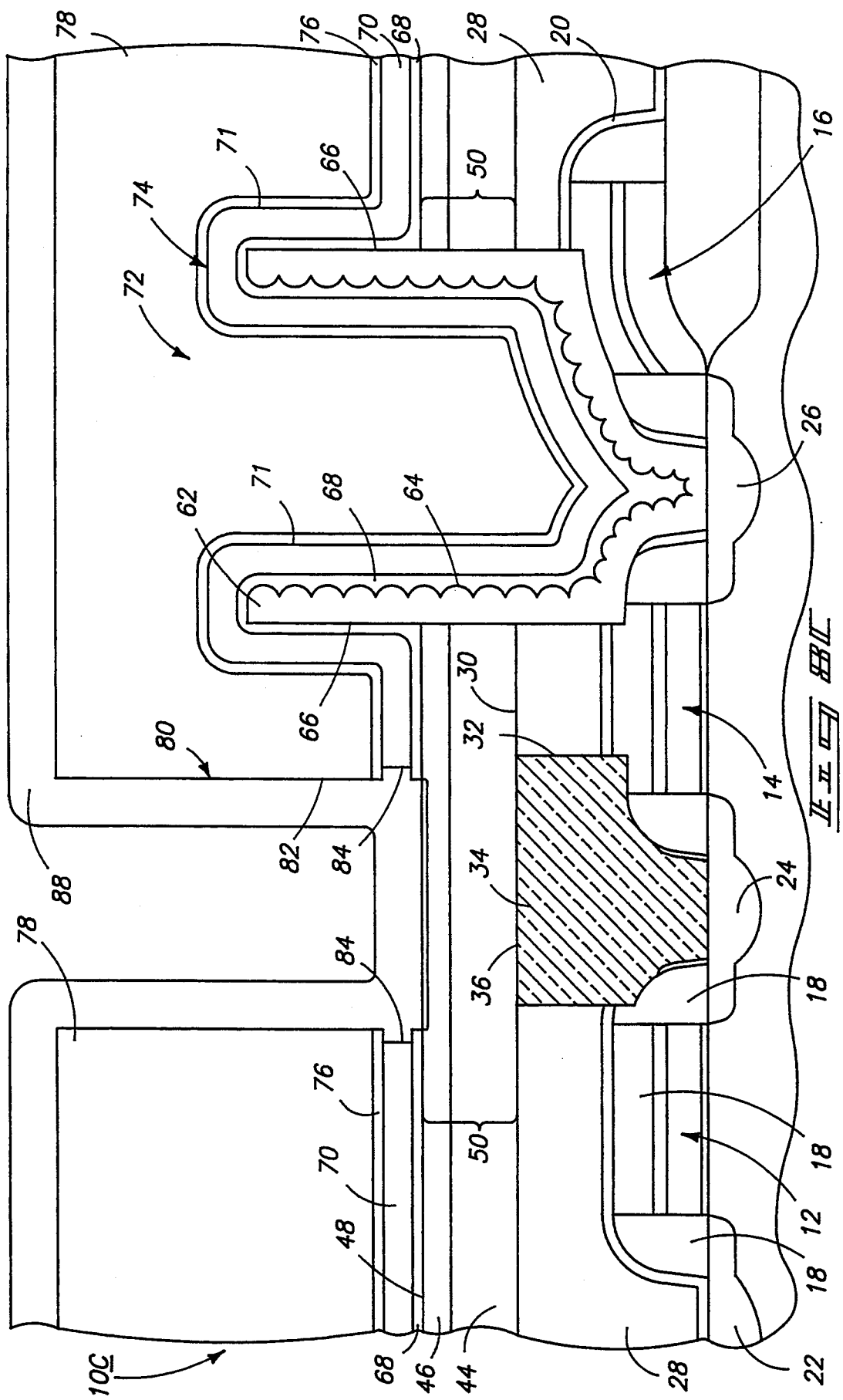

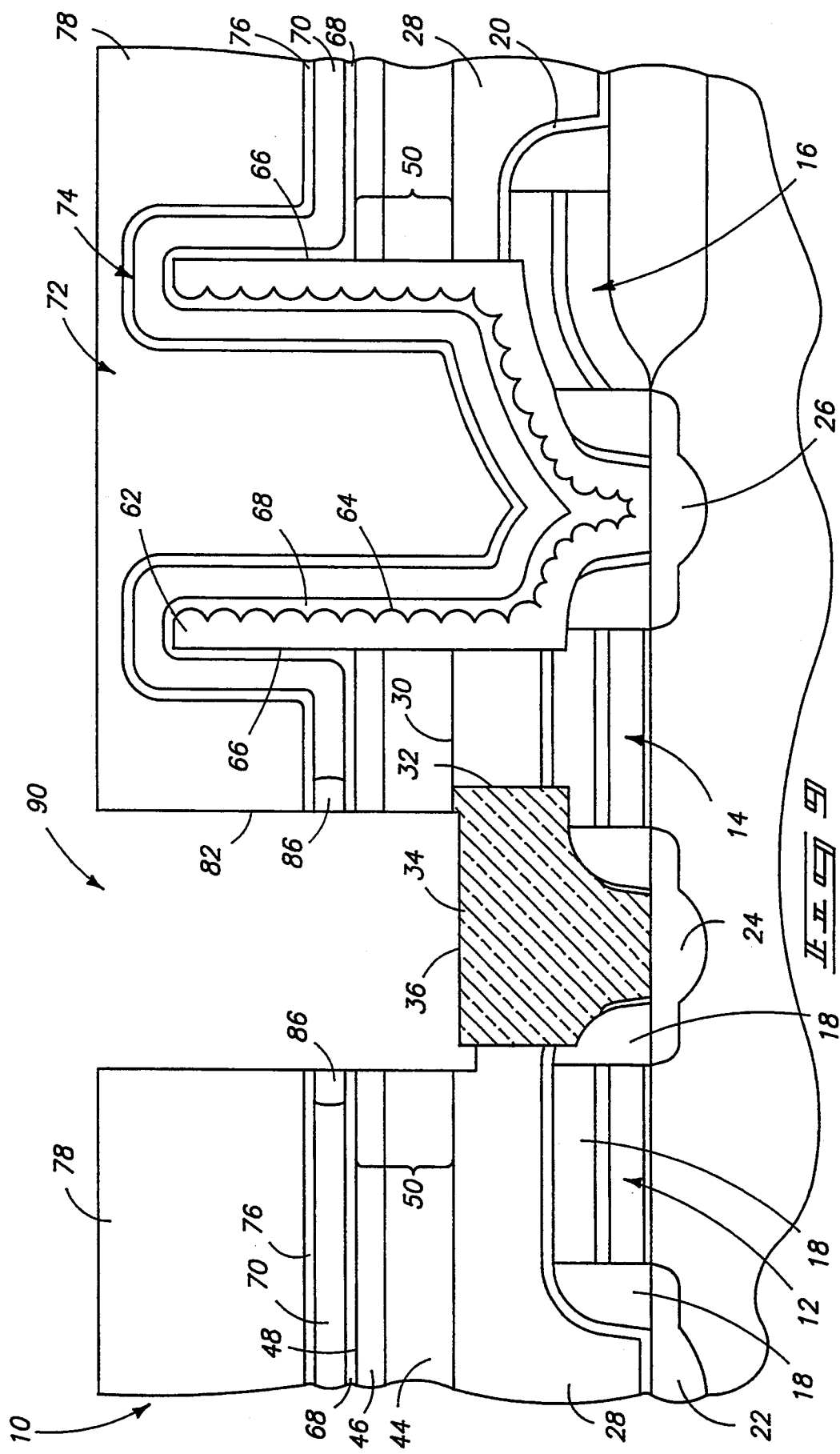

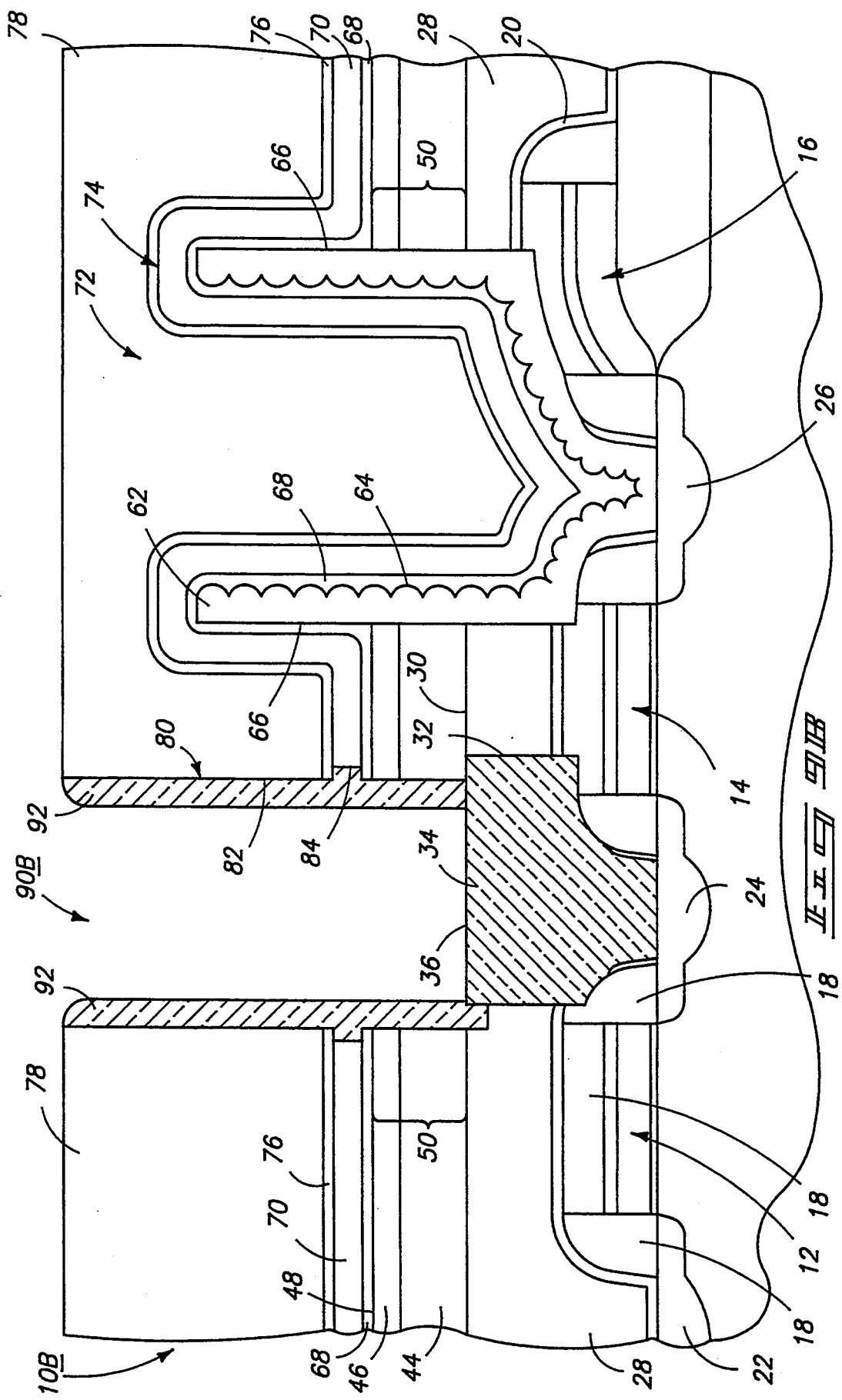

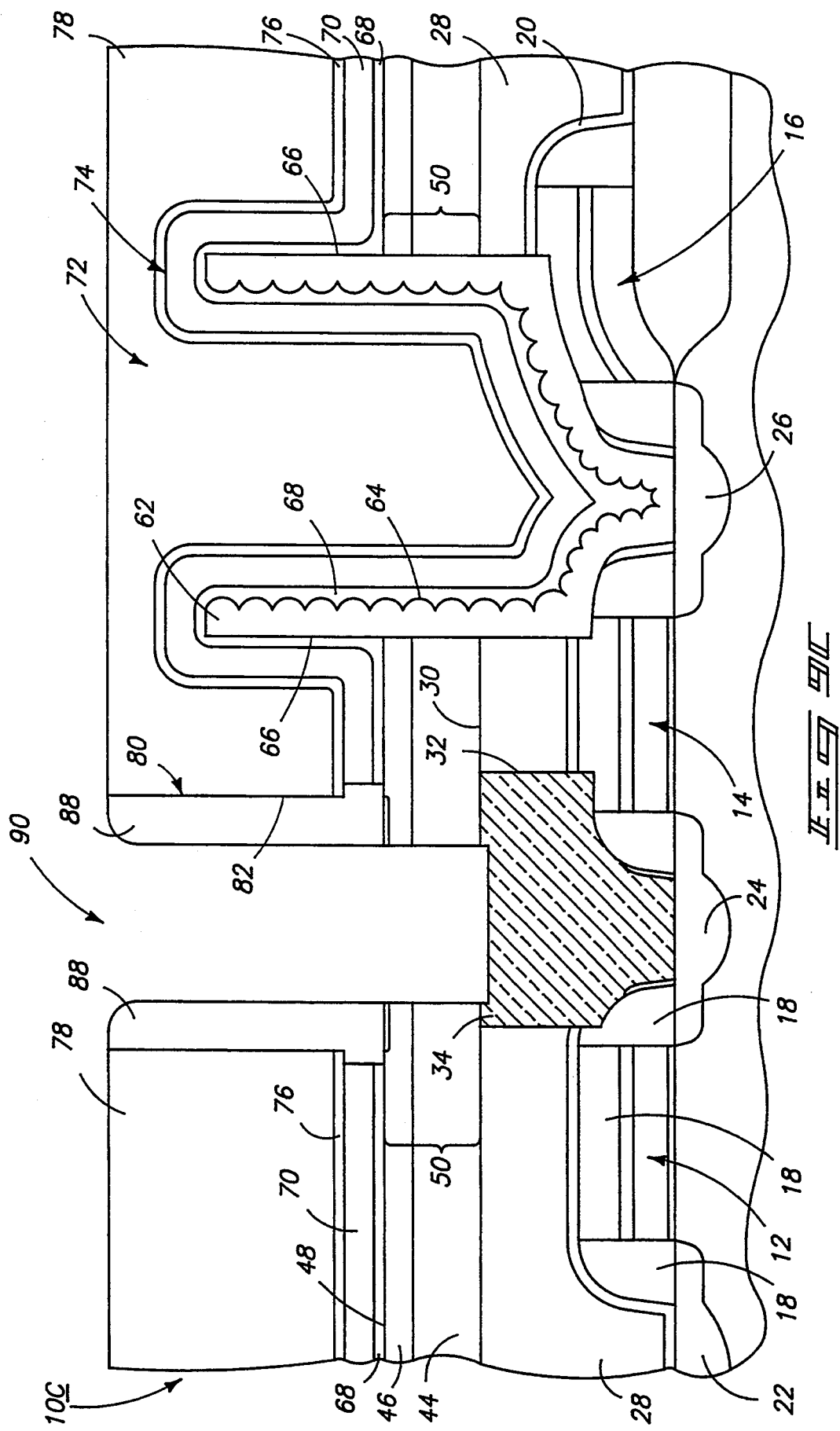

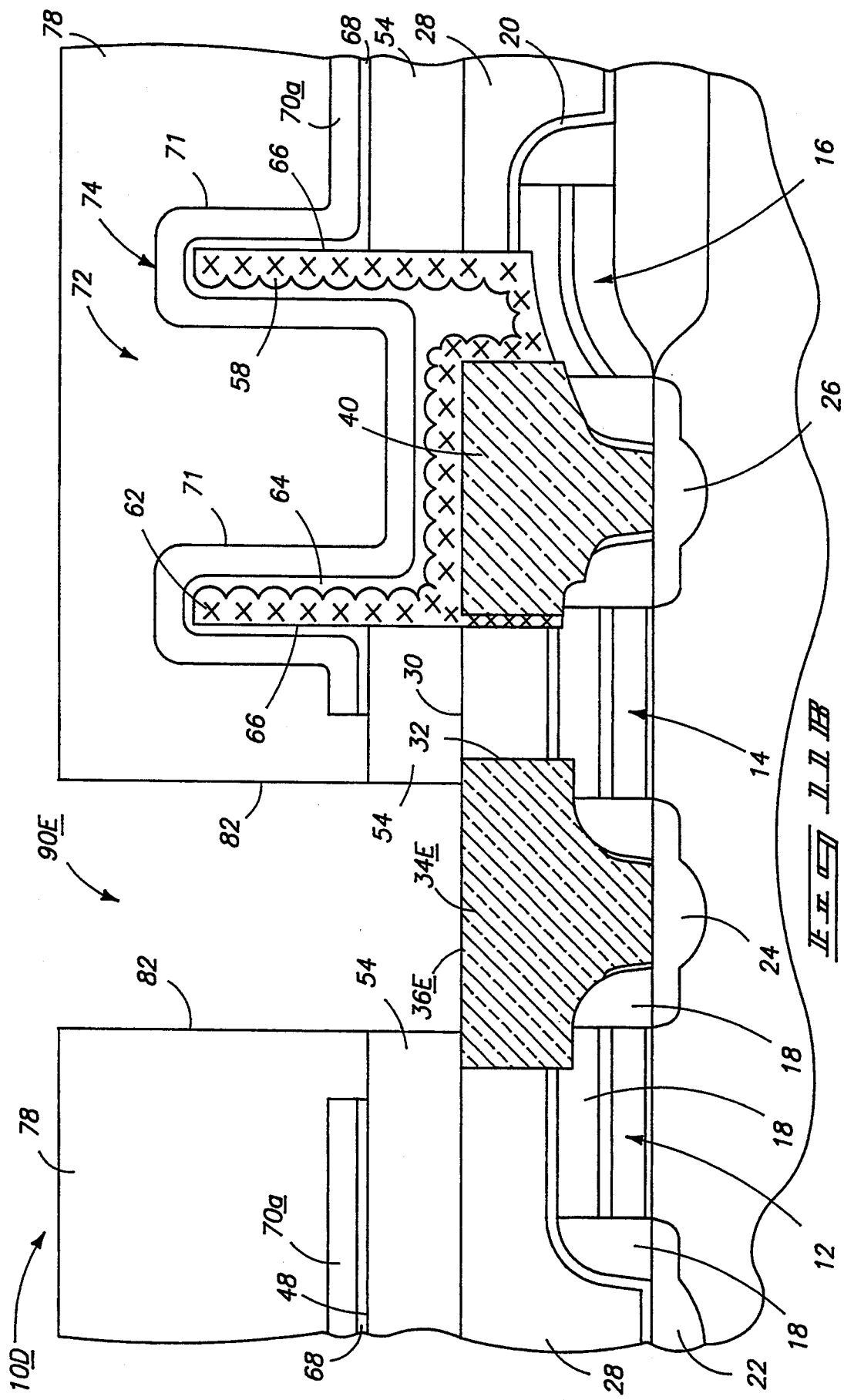

METHOD OF FORMING A BIT LINE OVER CAPACITOR ARRAY OF MEMORY CELLS

TECHNICAL FIELD

This invention relates generally to formation of a bit line over capacitor array of memory cells.

BACKGROUND OF THE INVENTION

As DRAMs increase in memory cell density, there is a continuous challenge to maintain sufficiently high storage capacitance despite decreasing cell area. Additionally, there is a continuing goal to further decrease cell area. The principal way of increasing cell capacitance is through cell structure techniques. Such techniques include three-dimensional cell capacitors, such as trenched or stacked capacitors.

Conventional stacked capacitor DRAM arrays utilize either a buried bit line or a non-buried bit line construction. With buried bit line constructions, bit lines are provided in close vertical proximity to the bit line contacts of the memory cell field effect transistors (FETs), with the cell capacitors being formed horizontally over the top of the word lines and bit lines. With non-buried bit line constructions, deep vertical contacts are made through a thick insulating layer to the cell FETs, with the capacitor constructions being provided over the word lines and beneath the bit lines. Such non-buried bit line constructions are also referred to as "capacitor-under-bit line" or "bit line-over-capacitor" constructions, and are the subject of this invention.

BRIEF DESCRIPTION OF THE DRAWINGS

Preferred embodiments of the invention are described below with reference to the following accompanying drawings.

FIG. 3 is a diagrammatic section of the FIG. 1 wafer illustrated at a processing step subsequent to that shown by FIG. 2.

FIG. 4 is a diagrammatic section of the FIG. 1 wafer illustrated at a processing step subsequent to that shown by FIG. 3.

FIG. 4A is a diagrammatic section of the FIG. 2A wafer illustrated at a processing step subsequent to that shown by FIG. 2A, and corresponds in sequence with the step shown by FIG. 4.

FIG. 5 is a diagrammatic section of the FIG. 1 wafer illustrated at a processing step subsequent to that shown by FIG. 4.

FIG. 6 is a diagrammatic section of the FIG. 1 wafer illustrated at a processing step subsequent to that shown by FIG. 5.

FIG. 6B is a diagrammatic section of the FIG. 5 wafer illustrated at an alternate processing step subsequent to that shown by FIG. 5, and corresponds in sequence to that shown by FIG. 6. There is no FIG. 6A.

FIG. 7 is a diagrammatic section of the FIG. 1 wafer illustrated at a processing step subsequent to that shown by FIG. 6.

FIG. 7B is a diagrammatic section of the FIG. 6B wafer illustrated at processing step subsequent to that shown by FIG. 6B, and corresponds in sequence to the step shown by FIG. 7. There is no FIG. 7A.

FIG. 8 is a diagrammatic section of the FIG. 1 wafer illustrated at a processing step subsequent to that shown by FIG. 7.

FIG. 8C is a diagrammatic section of the FIG. 7 wafer illustrated at a processing step subsequent to that shown by FIG. 7, and corresponds in sequence to the step shown by FIG. 8. There are no FIGS. 8A or 8B.

FIG. 9 is a diagrammatic section of the FIG. 1 wafer illustrated at a processing step subsequent to that shown by FIG. 8.

FIG. 9B is a diagrammatic section of the FIG. 7B wafer illustrated at a processing step subsequent to that shown by FIG. 7B, and corresponds in sequence to the step shown by FIG. 9. There is no FIG. 9A.

FIG. 9C is a diagrammatic section of the FIG. 8C wafer illustrated at a processing step subsequent to that shown by FIG. 8C, and corresponds in sequence to the step shown by FIG. 9.

FIGS. 11 and 11B are diagrammatic sections of a wafer processed in accordance with alternate aspects of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

In accordance with one aspect of the invention, a method of forming a bit line over capacitor array of memory cells comprises:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a planarized first layer of an insulating material over the word lines and active areas, the planarized layer of insulating material having an upper surface which is above the word lines;

providing first contact openings through the first layer of insulating material to second active regions;

providing first conductive material pillars within the first contact openings, the first pillars having upper surfaces which are elevationally above the word lines;

providing a covering layer of insulating material over the planarized first layer of insulating material and first pillars;

providing capacitor contact openings through the covering layer to electrically connect with the first active regions;

providing capacitors within the capacitor contact openings;

providing an overlying layer of insulating material over the covering layer of insulating material and over the capacitors;

providing bit line contact openings through the overlying layer and the covering layer to the first pillar upper surfaces; and providing a digit line layer of conductive material atop the wafer and within the bit line contact openings, the digit line layer electrically connecting with the first pillar upper surfaces.

The word "contact" as used in this document includes container-wide openings, such as for forming capacitor constructions.

Multiple preferred embodiments are collectively shown by the accompanying drawings, as will become apparent from the continuing discussion. Related technical disclosures can be found in our U.S. patent application Ser. No. 08/044,824, filed on Apr. 7, 1993 and entitled "Semiconductor Processing Methods Of Forming Stacked Capacitors", and U.S. patent application Ser. No. 07/838,537, now U.S. Pat. No. 5,206,183, filed on Feb. 19, 1992, and entitled "Method Of Forming A Bit Line Over Capacitor Array of Memory Cells", which are each hereby incorporated by reference.

Figure 1:
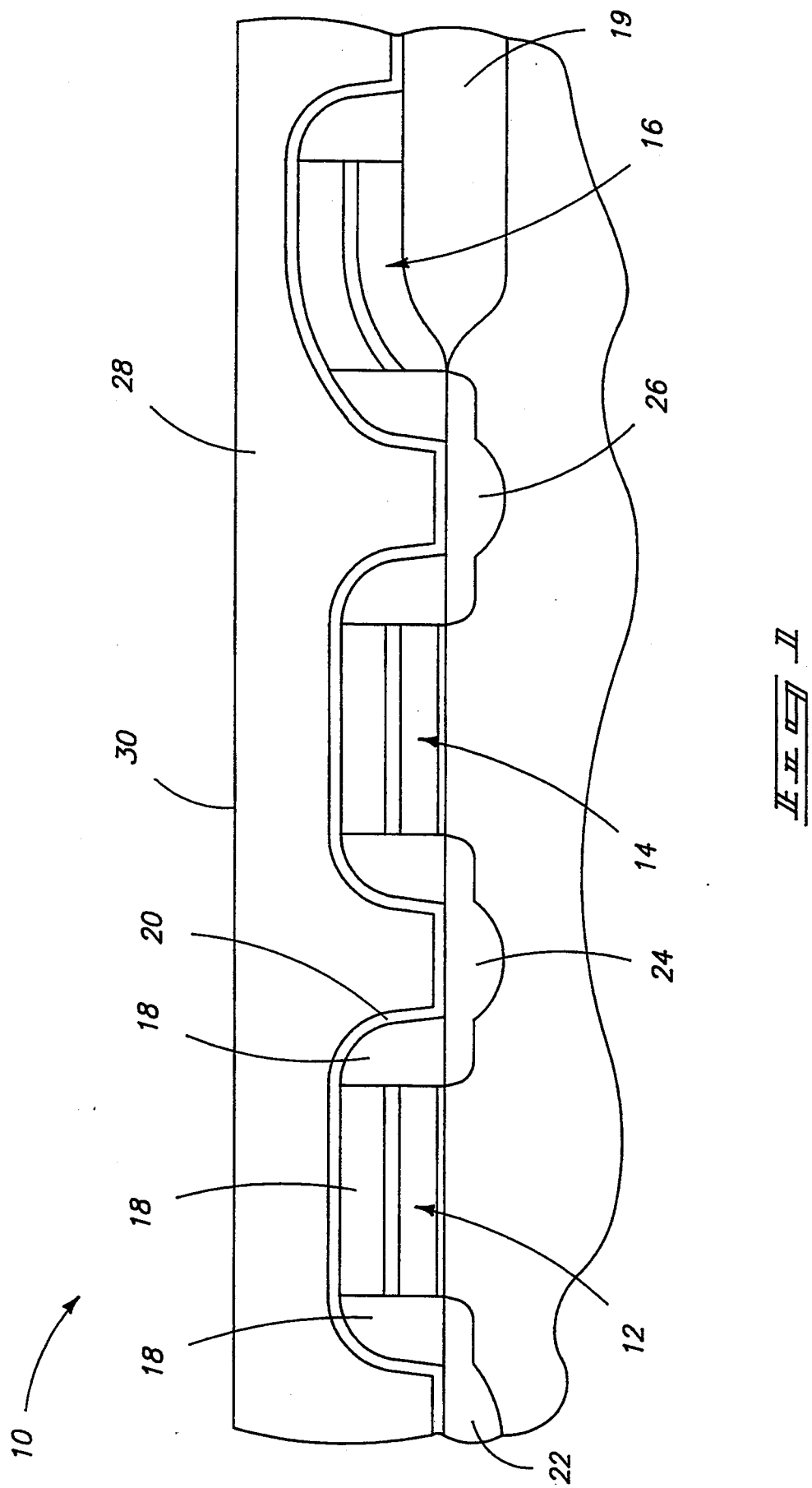
FIG. 1 is a diagrammatic section of a semiconductor wafer shown at one processing step in accordance with the invention.

Referring first to FIG. 1, a semiconductor wafer is indicated generally by reference numeral 10. Wafer 10 has been provided with an array of substantially electrically isolated word lines, such as the illustrated word lines 12, 14 and 16. Such word lines are of a conventional construction having a lowermost gate oxide, a lower polysilicon layer, an overlying silicide layer such as tungsten silicide, and insulating caps and side insulating spacers 18. Such spacers and caps 18 preferably comprise an insulative nitride, such as $Si_3N_4$. A thin layer 20 of $Si_3N_4$ is provided atop the wafer to function as a diffusion barrier. Layer 20 has a thickness which is preferably from about 100 Angstroms to about 250 Angstroms.

Active areas are provided about the word lines, such as active regions 22, 24 and 26, to define an array of memory cell FETs. The discussion proceeds with reference to a FET formed with word line 14, which will be provided with a capacitor construction for definition of a single memory cell. Active region 26 defines a first active region for electrical connection with a memory cell capacitor (described below). Active region 24 defines a second active region for electrical connection with a bit line (described below). Field oxide 19 is provided, as shown.

A planarized first layer 28 of an insulating material is provided over the word lines and active area. An example and preferred material is borophosphosilicate glass (BPSG) which is planarized back by chemical mechanical polishing (CMP) to an elevation of from about 2000 Angstroms to about 4000 Angstroms above the word line nitride caps 18 which are positioned adjacent the active areas, as opposed to the word lines over the field oxide. Such provides a planarized upper surface 30 which is elevationally above the word lines.

Figure 2:
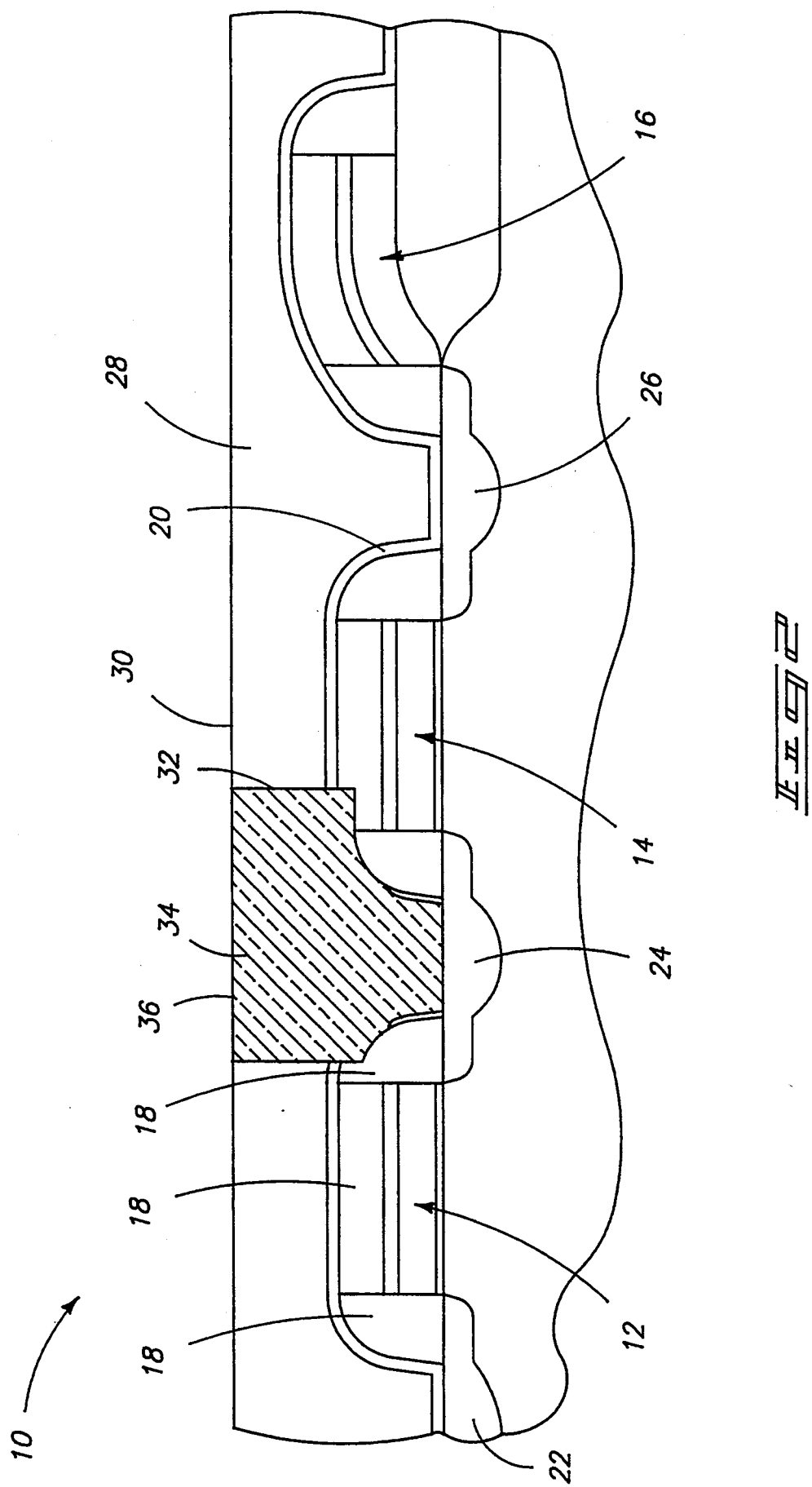
FIG. 2 is a diagrammatic section of the FIG. 1 wafer illustrated at a processing step subsequent to that shown by FIG. 1.

Referring to FIG. 2, a series of first contact openings 32 is provided through first layer 28 to second active regions 24 to provide bit line connections. Such would typically be conducted by photomasking and dry chemical etching of BPSG selective to nitride. An example etch chemistry would include $CHF_3$ and $O_2$ at low $O_2$ flow rate (i.e., less than 5% $O_2$ by volume in a $CHF_3/O_2$ mixture), or the combination of $CF_4$, AR, $CH_2F_2$ and $CHF_3$. Thereafter, a blanket etch of the wafer is conducted to etch nitride layer 20 selectively to silicon to upwardly expose active area 24. An example etch chemistry would include a combination of $CHF_3$ and $CF_4$. The principle purpose of barrier layer 20 is to prevent diffusion of boron or phosphorous atoms from BPSG layer 28 into active areas 24 and 26. Caps 18 are preferably comprised of nitride ($Si_3N_4$) where layer 28 is comprised of oxide, such that the contact etch to produce first contacts 32 will stop relative to word lines spacers and caps 18.

Thereafter, first conductive material pillars 34 are provided within first contact openings 32. An example and preferred material for pillars 34 is in situ As doped polysilicon. Such is preferably provided by deposition of a polysilicon layer, followed by CMP to upper surface 30 of BPSG layer 28. Such produces first pillar upper surfaces 36 which are elevationally above the word line and coincide with upper surfaces 30 of BPSG layer 28.

Figure 2A:
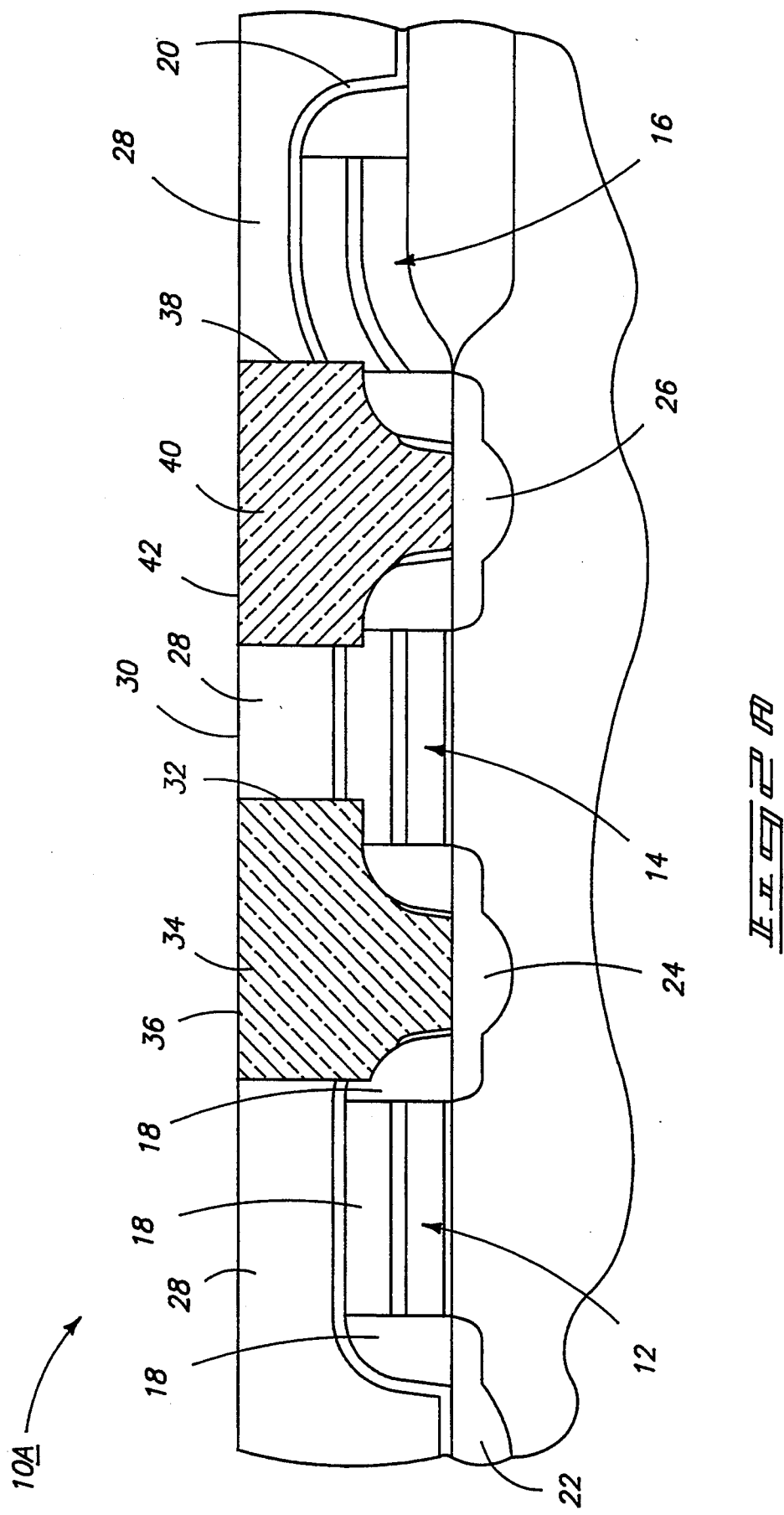
FIG. 2A is a diagrammatic section of the FIG. 1 wafer illustrated at an alternate processing step subsequent to that shown by FIG. 1.

Alternately in accordance with the invention, buried capacitor contacts/containers and associated pillars can be provided along with the bit line contacts and pillars. Specifically, FIG. 2A illustrates a wafer 10A having second contact openings 38 extending through first layer 28 to first active regions 26. Such are filled with second conductive material pillars 40 having upper surfaces 42 coinciding with surfaces 30 and 36. Such would be provided simultaneously with the creation of contact openings 32 and pillars 34, and accordingly preferably comprise in situ conductively doped polysilicon.

Referring to FIG. 3, a layer 44 of insulating material is provided to a thickness of from about 500 Angstroms to about 3000 Angstroms, with about 1500 Angstroms being most preferred. Layer 44 preferably principally comprises an oxide, such as $SiO_2$ deposited by decomposition of tetraethylorthosilicate (TEOS). A layer 46 is deposited atop TEOS layer 44. Layer 46 preferably comprises $Si_3N_4$ deposited by low pressure chemical vapor deposition (LPCVD) to a thickness from about 100 Angstroms to about 1000 Angstroms, and thus defining an upper surface 48. In combination, and for purposes of the continuing discussion, layers 44 and 46 constitute a planarized base layer 50 having a defined first thickness (preferably about 2000 Angstroms) and uppermost region defined by layer 46. Thus in accordance with the preferred embodiment, base layer 50 is not homogeneous, with uppermost region 46 being formed of a different material from remaining portions 44 of the base layer. An intermediate layer 52 of insulating material is provided atop uppermost region 46 of base layer 50. The insulating material of intermediate layer 52 is different in composition from the insulating material of uppermost region 46, with the insulating material of intermediate layer 52 being selectively etchable relative to the insulating material of such uppermost region 46. An example and preferred material for layer 52 is BPSG deposited to a thickness of approximately 7500 Angstroms. As illustrated, and for purposes of the continuing discussion, intermediate layer 52 and base layer 50 in combination constitute a covering layer 54. Thus in the illustrated and preferred embodiment, covering layer 54 is not homogeneous.

Referring to FIG. 4, capacitor contact openings 56 are provided through covering layer 54 to electrically connect with first active regions 26. Such would be conducted by a series of oxide and nitride etches until first active area 26 is upwardly exposed. FIG. 4A sequentially illustrates processing of wafer 10A to produce capacitor contact openings 56a, where second pillars 40 were provided. Where such pillars 40 are provided and comprise polysilicon, the etch is conducted to finally be selective to both polysilicon and largely to nitride. A layer 58 (FIGS. 4 and 4A) of conductive material is provided over covering layer 54 (intermediate layer 52) and within capacitor contact opening 56. Conductive material layer 58 has an outer surface 60. Layer 58 preferably comprises in situ As doped hemispherical grain (HSG) polysilicon.

Figure 5A:
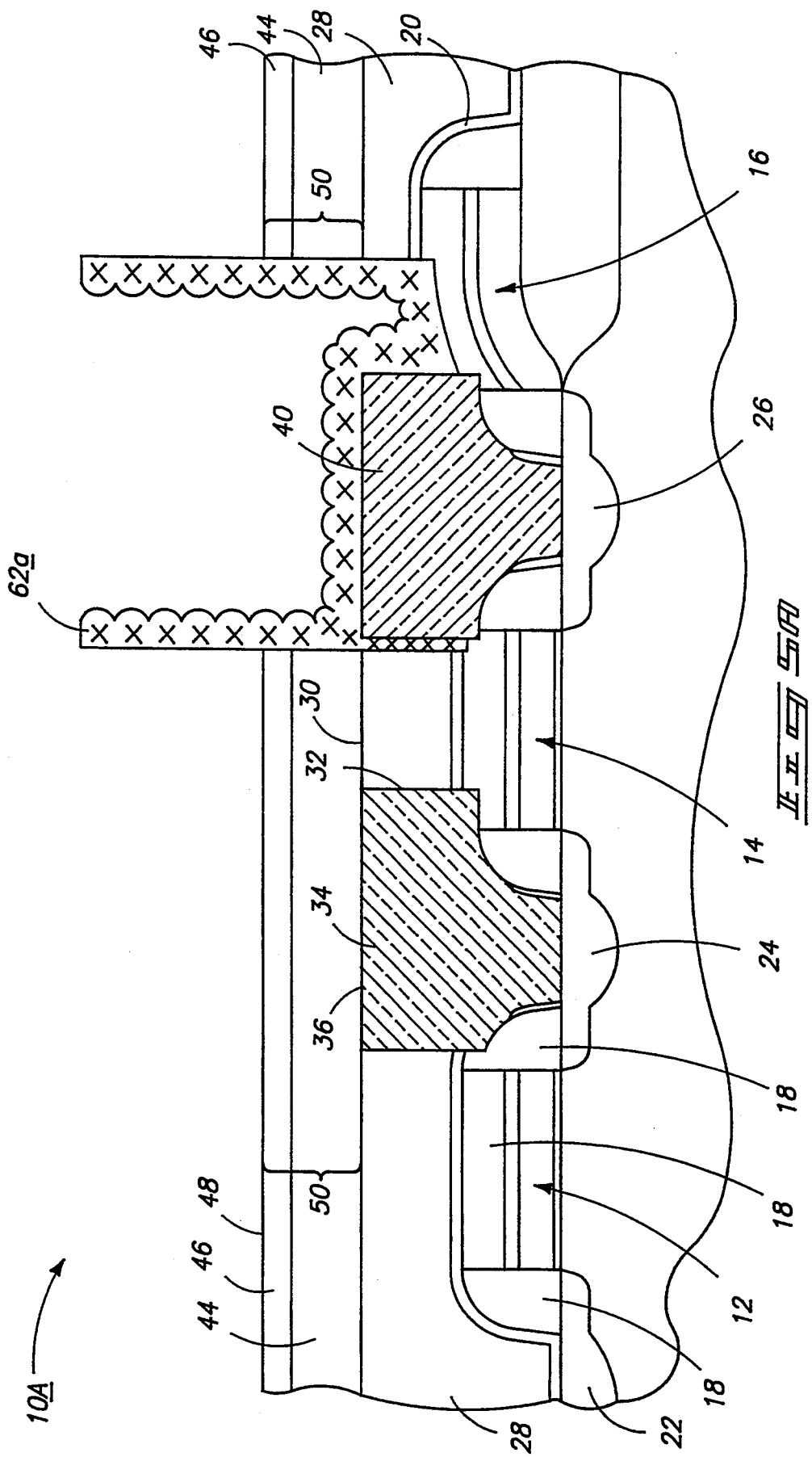
FIG. 5A is a diagrammatic section of the FIG. 2A wafer illustrated at a processing step subsequent to that shown by FIG. 4A, and corresponds in sequence to the step shown by FIG. 5.

Referring to FIG. 5, conductive material from atop covering layer 54 is removed preferably by CMP technique to define isolated cell storage node containers 62 which electrically connect with first active regions 26. FIG. 5A illustrates a slightly differently configured isolated container 62a which connects through second pillars 40 electrically with first active regions 26. For purposes of the continuing discussion, isolated cell storage node containers 62 define or have internal sidewalls 64 and external sidewalls 66 (FIG. 5).

Insulating material of covering layer 54 is removed to expose only a portion of external sidewalls 66 of isolated cell storage node containers 62. Specifically, intermediate layer 52 is selectively etched relative to the material of isolated capacitor storage node 62 and uppermost region 46 of base layer 50. In such manner, uppermost region 46 of base layer 50 is utilized as an etch stop during such etching. Where uppermost region 46 comprises nitride, intermediate layer 52 comprises BPSG, and the isolated capacitor storage nodes comprise polysilicon, an example suitable etch chemistry would include dilute HF (10:1 $H_2O$:HF) wet etch.

Referring to FIG. 6, a conventional or other suitable capacitor cell dielectric layer 68 is provided uniformly on the wafer atop isolated storage nodes 62. Thus, insulating material of base layer 50 is interposed between first pillar upper surfaces 36 and capacitor cell dielectric layer 68. A conductive capacitor cell layer 70 is provided atop capacitor cell dielectric layer 68, thus defining an array of memory cell capacitors 72 on the wafer. Layer 70 has an outer surface 71. Individual memory cell capacitors, such as the illustrated capacitor 72, of the array are thus provided within the capacitor contact openings, and are defined by an outwardly projecting container structure having a projecting outermost surface 74. Layer 70 preferably comprises conductively doped polysilicon.

An electrically insulative nitride oxidation barrier layer 76, such as $Si_3N_4$, is provided atop cell capacitor layer 70 to a thickness of from about 150 Angstroms to about 1500 Angstroms. The purpose of such layer is described below.

An overlying layer 78 of insulating material is provided over oxidation barrier layer 76 and correspondingly conductive capacitor cell layer 70, and preferably comprises BPSG. Thus, an overlying layer of insulating material is provided over covering layer 54 and over the capacitors 72. Overlying layer 78 is planarized back to a second thickness above outermost surface 74, with the second thickness being greater than the first thickness of base layer 50. An example second thickness would be 7000 Angstroms.

FIG. 6B illustrates a wafer 10B showing an alternate process where the second thickness is not greater than the first thickness, with the second thickness being approximately 4000 Angstroms. The significance of the second thickness relative to the first thickness will become apparent from the continuing discussion.

Referring to FIG. 7, preliminary bit line contact openings 80 are provided through overlying layer 78, oxidation barrier layer 76, conductive capacitor cell layer 70, and cell capacitor dielectric layer 68 over first pillars 34, in an anisotropic progressive manner, to essentially stop on uppermost region 46 of base layer 50. Preliminary bit contact openings 80 have interior sidewalls 82 which include a pair of exposed edges 84 of cell polysilicon layer 70. At the latter stages during such anisotropic etch of polysilicon layer 70, conditions are modified slightly to induce an isotropic etch to obtain an undercut etch into polysilicon exposed edges 84, as shown. Wafer 10 is then exposed to oxidizing ambient conditions to oxidize the cell polysilicon exposed edges to form insulating $SiO_2$ regions 86 (FIG. 8). Example oxidizing ambient conditions to produce the desired regions 86 would include $H_2$ and $O_2$ at 850° C. in a conventional atmospheric furnace tube. A reason for undercut into cell polysilicon layer 70 is to prevent regions 86 from undesirably projecting considerably into preliminary bit line contact opening 80.

Exposure of a wafer to oxidizing ambient conditions typically causes oxidation of silicon, and even that silicon which underlies such insulating layers as phosphosilicate glass (PSG) and BPSG. In accordance with an aspect of the invention, nitride oxidation barrier layer 76 during exposure to an oxidizing ambient inhibits oxidation of outer surface 71 of cell polysilicon layer 70 which otherwise could occur through material of overlying layer 78. Additionally, uppermost region/layer 46 during oxidizing ambient exposure inhibits oxidation of the lower portion of outer sidewalls 66 of isolated capacitor storage node 72.

FIG. 8C illustrates a wafer 10C where an alternate technique has been employed for isolating conductive cell edges 84. Such occurs by deposition of an insulative oxide or nitride layer 88. Such a technique has the drawback of diminishing the width of preliminary bit line contact opening 80, and thus the quantity of conductive material which will ultimately be used to fill such opening.

Referring to FIG. 9, base layer 50 and overlying layer 78 are blanket etched without photomasking to extend preliminary bit line contact opening 80 to first pillar upper surface 36, thus defining a completed bit line contact opening 90. Thus, a bit line contact opening 90 is provided through overlying layer 78 and covering layer 54. Such an etch also leaves insulating material of overlying layer 78 atop projecting outermost surfaces 74 of the individual capacitor cell containers. Blanket etching in this manner is enabled by second thickness of overlying layer 78 above outermost surfaces 74 being greater than the first thickness of base layer 50. Slight undesired misalignment of contact 90 relative to plug 34 is shown, causing some overetch into insulating layer 28.

FIG. 7B illustrates an alternate embodiment wherein the second thickness was not made to be greater than the first thickness. Here, the etch for the bit line contact to the pillar is not stopped on uppermost region/layer 46 for purposes of electrically insulating the exposed conductive cell layer edges. Rather, complete etching of a bit line contact opening 90b is conducted inwardly to upwardly expose first pillar upper surface 36. To insulate such exposed edges, FIG. 9B illustrates deposition of a thin oxide or nitride layer 92 which has been subjected to a spacer etch. FIG. 9C illustrates a step subsequent to that of FIG. 8C for extending the contact to upper surface 36 of first pillars 34.

Figure 10:
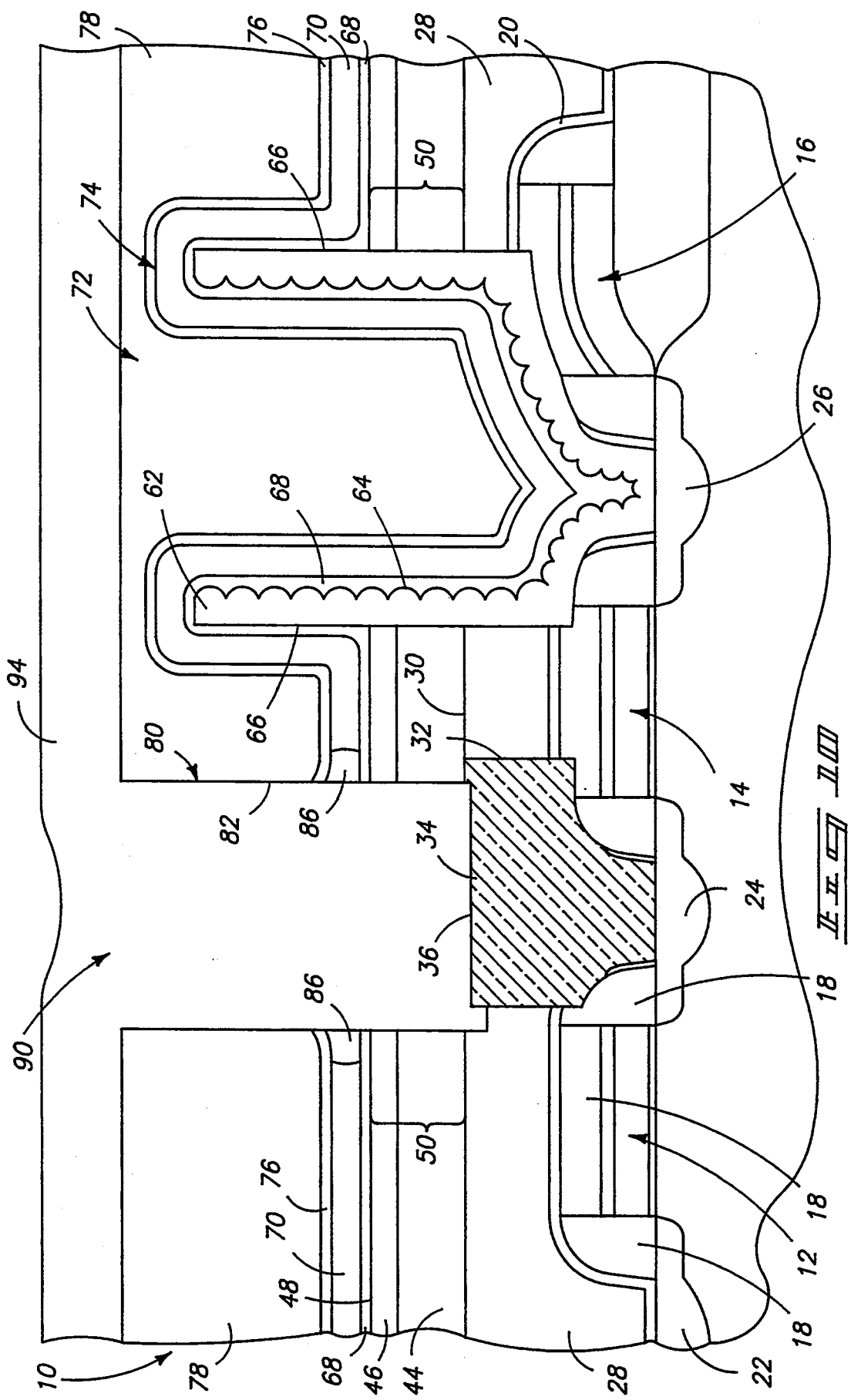
FIG. 10 is a diagrammatic section of the FIG. 1 wafer illustrated at a processing step subsequent to that shown by FIG. 9.
Figure 11:
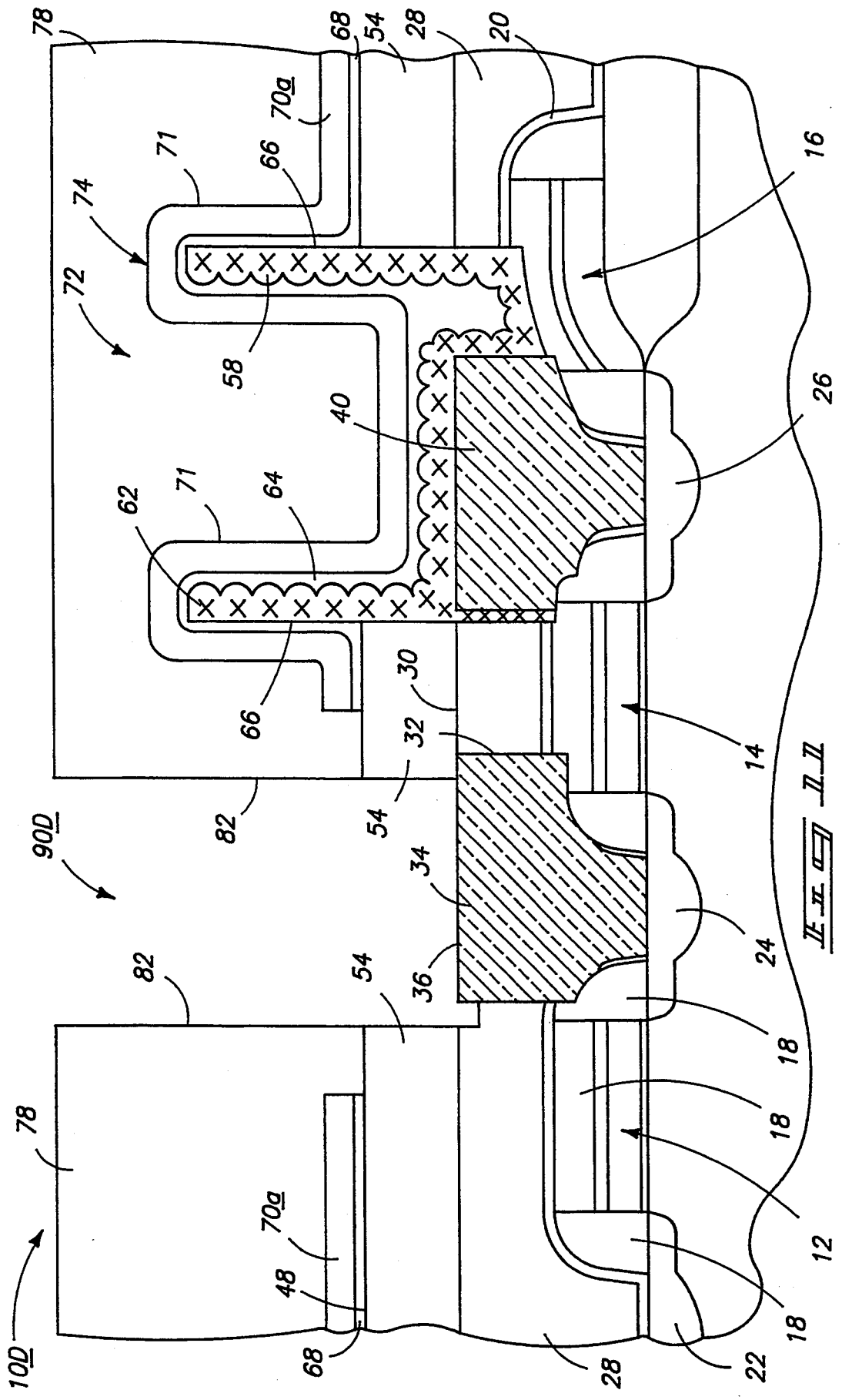

Referring to FIG. 10, a digit line layer 94, such as metal or conductively doped polysilicon, is provided atop the wafer and within the complete bit line contact openings 90, and thus electrically connects with first pillar upper surfaces 36 for establishing electrical connection with second active regions 24.

Figure 11:
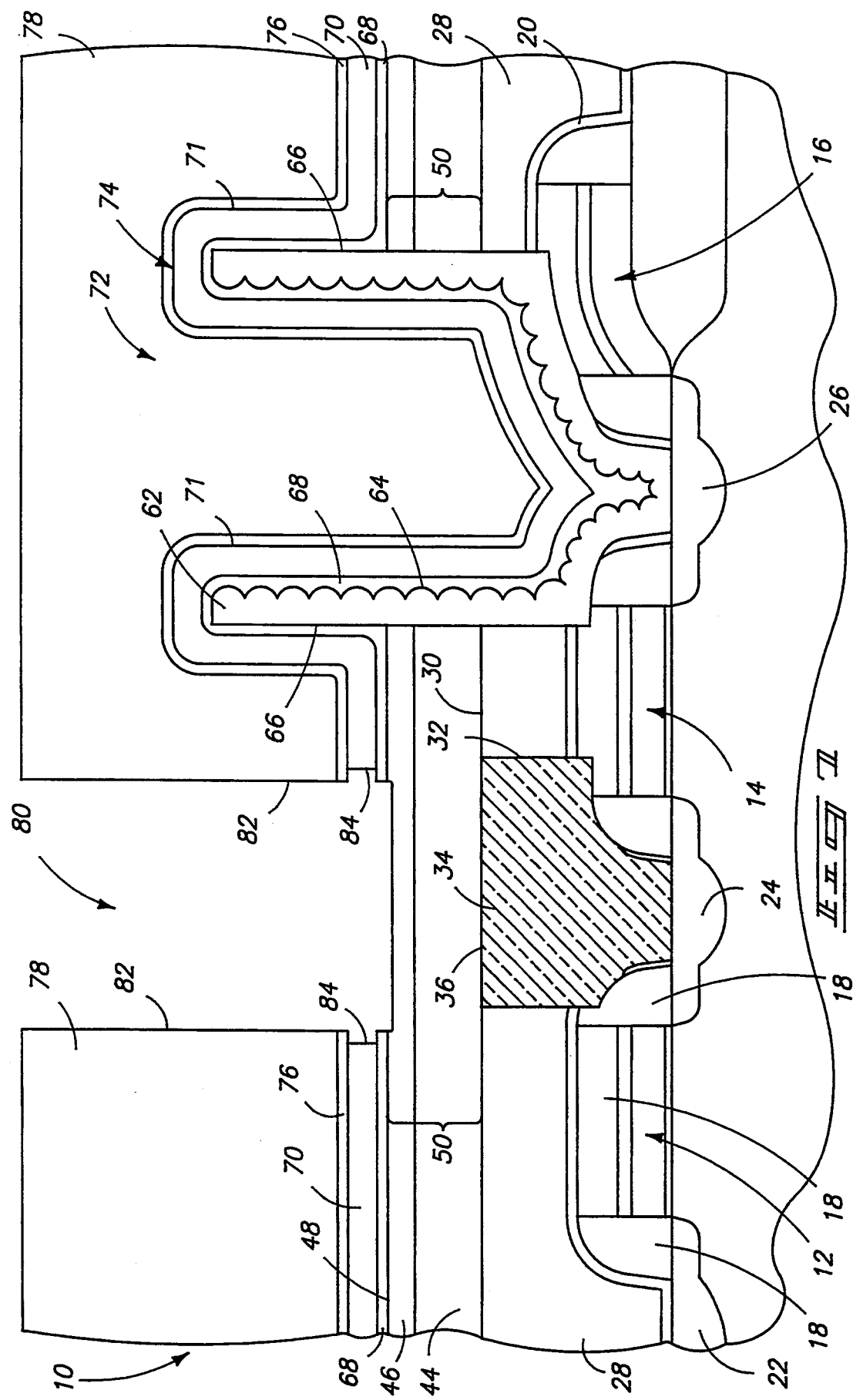

FIG. 11 illustrates an alternate process whereby cell polysilicon in the form of layer 70a is effectively patterned prior to deposition of overlying layer 78. Thus the bit line contact 90d is required to be provided only through overlying layer 78 and covering layer 54 to expose bit pillar 34 upper surface 36. From FIG. 11, a digit line layer of conductive material would be provided atop wafer 10d and within bit line contact openings 90d, with the digit line layer electrically connecting with the first pillar upper surfaces 36.

FIG. 12 illustrates a slightly modified process relative to that shown by FIG. 11. Here, pillar 34e has been fabricated to be sufficiently wide such that open cross section of contact 90e is assured of falling entirely within the confines of pillar surface area 36e. When the bit contact poly pillar (i.e., 34e) significantly overlaps relative to the bit contact (i.e., 90e), the bit contact photo/etch can be combined with the peripheral contact photo/etch for process simplification. Note that in forming peripheral contacts, the etch step will etch insulators 78, 54, 28 and 20 for active area contacts, or insulators 78, 54, 28, 20 and 18 for poly 1 (word line poly) contacts, with all such etching being selective to silicon. In accordance with this aspect of the invention, the probable larger size of area 36e would probably require an overall increase in memory cell size, but the processing steps are reduced.

In compliance with the statue, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

We claim:

1. A method of forming a bit line over capacitor array of memory cells comprising:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a planarized first layer of an insulating material over the word lines and active areas, the planarized layer of insulating material having an upper surface which is above the word lines;

providing first contact openings through the first layer of insulating material to second active regions;

providing first conductive material pillars within the first contact openings, the first pillars having upper surfaces which are elevationally above the word lines;

providing a covering layer of insulating material over the planarized first layer of insulating material and first pillars;

providing capacitor contact openings through the covering layer to electrically connect with the first active regions;

providing capacitors within the capacitor contact openings;

providing an overlying layer of insulating material over the covering layer of insulating material and over the capacitors;

providing bit line contact openings through the overlying layer and the covering layer to the first pillar upper surfaces; and providing a digit line layer of conductive material atop the wafer and within the bit line contact openings, the digit line layer electrically connecting with the first pillar upper surfaces.

2. The method of forming a bit line over capacitor array of memory cells of claim 1 wherein the first conductive material pillars have an upper surface area and the bit line contact openings have an open cross section, and wherein the step of providing bit line contact openings comprises photopatterning and etching, the method further comprising:

fabricating the surface area of individual first conductive material pillars to be greater than the open cross section of individual bit line contact openings to substantially assure complete overlap of the individual bit line contact openings relative to the individual first conductive material pillar surface areas; and photopatterning and etching area on the wafer peripheral to the memory array in the same step in which the bit line contact openings are photopatterned and etched.

3. A method of forming a bit line over capacitor array of memory cells comprising:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a planarized first layer of an insulating material over the word lines and active areas, the planarized layer of insulating material having an upper surface which is above the word lines;

providing first contact openings through a first layer of insulating material to second active regions;

providing first conductive material pillars within the first contact openings, the first pillars having upper surfaces which are elevationally above the word lines;

providing a covering layer of insulating material over the planarized first layer of insulating material and first pillars;

providing capacitor contact openings through the covering layer to electrically connect with the first active regions;

providing a layer of conductive material over the covering layer of insulating material and within the capacitor contact openings, the layer of conductive material having an outer surface;

removing conductive material from atop the covering layer to define isolated cell storage node containers electrically connecting with the first active regions;

providing a capacitor cell dielectric layer on the wafer atop the isolated storage nodes, insulating material of the covering layer being interposed between the first pillar upper surfaces and the capacitor cell dielectric layer;

providing a conductive capacitor cell layer atop the capacitor cell dielectric layer to define an array of memory cell capacitors;

providing an overlaying layer of insulating material over the conductive capacitor cell layer;

providing bit line contact openings through the overlying layer, conductive capacitor cell layer, cell capacitor dielectric layer and covering layer to the first pillar upper surfaces, the bit line contact openings having sidewalls, the bit line contact opening sidewalls including exposed edges of the conductive capacitor cell layer;

electrically insulating exposed edges of the conductive capacitor cell layer within the bit line contact openings; and after electrically insulating the exposed edges, providing a digit line layer of conductive material atop the wafer and within the bit line contact openings, the digit line layer electrically connecting with the first pillar upper surfaces.

4. The method of forming a bit line over capacitor array of memory cells of claim 3 wherein the covering layer is not homogeneous.

5. The method of forming a bit line over capacitor array of memory cells of claim 3 wherein the material of the first conductive pillars and the material of the conductive layer provided over the covering layer comprises conductively doped polysilicon.

6. The method of forming a bit line over capacitor array of memory cells of claim 3 wherein the material of the first conductive pillars and the material of the conductive layer provided over the covering layer comprises conductively doped polysilicon, and the method further comprising:

providing an electrically insulative nitride oxidation barrier layer atop the cell capacitor layer to a thickness of from about 150 Angstroms to about 1500 Angstroms prior to providing the overlying insulating layer, the step of electrically insulating the exposed edges comprising exposing the wafer to an oxidizing ambient to oxidize the cell polysilicon exposed edges, the nitride oxidation barrier layer during such oxidation exposure inhibiting oxidation of the outer surface of the cell polysilicon layer.

7. The method of forming a bit line over capacitor array of memory cells of claim 3 wherein the first conductive material pillars have an upper surface area and the bit line contact openings have an open cross section, and wherein the step of providing bit line contact openings comprises photopatterning and etching, the method further comprising:

fabricating the surface area of individual first conductive material pillars to be greater than the open cross section of individual bit line contact openings to substantially assure complete overlap of the individual bit line contact openings relative to the individual first conductive material pillar surface areas; and photopatterning and etching area on the wafer peripheral to the memory array in the same step in which the bit line contact openings are photopatterned and etched.

8. A method of forming a bit line over capacitor array of memory cells comprising:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a planarized first layer of an insulating material over the word lines and active areas, the planarized layer of insulating material having an upper surface which is above the word lines;

providing first contact openings through the first layer of insulating material to second active regions;

providing first conductive material pillars within the first contact openings, the first pillars having upper surfaces which are elevationally above the word lines;

providing a covering layer of insulating material over the planarized first layer of insulating material and first pillars;

providing capacitor contact openings through the covering layer to electrically connect with the first active regions;

providing a layer of conductive material over the covering layer of insulating material and within the capacitor contact openings, the layer of conductive material having an outer surface;

removing conductive material from atop the covering layer to define isolated cell storage node containers electrically connecting with the first active regions, the isolated call storage node containers having internal sidewalls and external sidewalls;

removing insulating material of the covering layer to expose only a portion of the external sidewalls of the isolated cell storage node containers;

providing a capacitor cell dielectric layer on the wafer atop the isolated storage nodes including the exposed portions of the isolated storage node external sidewalls, insulating material of the covering layer being interposed between the first pillar upper surfaces and the capacitor cell dielectric layer;

providing a conductive capacitor cell layer atop the capacitor cell dielectric layer to define an array of memory cell capacitors;

providing an overlying layer of insulating material over the conductive capacitor cell layer;

providing bit line contact openings through the overlying layer, conductive capacitor cell layer, cell capacitor dielectric layer and covering layer to the first pillar upper surfaces, the bit line contact openings having sidewalls, the bit line contact opening sidewalls including exposed edges of the conductive capacitor cell layer;

electrically insulating exposed edges of the conductive capacitor cell layer within the bit line contact openings; and after electrically insulating the exposed edges, providing a digit line layer of conductive material atop the wafer and within the bit line contact openings, the digit line layer electrically connecting with the first pillar upper surfaces.

9. The method of forming a bit line over capacitor array of memory cells of claim 8 wherein the covering layer is not homogeneous.

10. The method of forming a bit line over capacitor array of memory cells of claim 8 wherein the material of the first conductive pillars and the material of the conductive layer provided over the covering layer comprises conductively doped polysilicon.

11. The method of forming a bit line over capacitor array of memory cells of claim 8 wherein the material of the first conductive pillars and the material of the conductive layer provided over the covering layer comprises conductively doped polysilicon, and the method further comprising:

providing an electrically insulative nitride oxidation barrier layer atop the cell capacitor layer to a thickness of from about 150 Angstroms to about 1500 Angstroms prior to providing the overlying insulating layer, the step of electrically insulating the exposed edges comprising exposing the wafer to an oxidizing ambient to oxidize the cell polysilicon exposed edges, the nitride oxidation barrier layer during such oxidation exposure inhibiting oxidation of the outer surface of the cell polysilicon layer.

12. A method of forming a bit line over capacitor array of memory cells comprising:

providing an array of substantially electrically isolated word lines atop a semiconductor wafer;

providing active areas about the word lines to define an array of memory cell FETs, the active areas being defined by a first active region for electrical connection with a memory cell capacitor and a second active region for electrical connection with a bit line;

providing a planarized first layer of an insulating material over the word lines and active areas, the planarized layer of insulating material having an upper surface which is above the word lines;

providing first contact openings through the first layer of insulating material to second active regions;

providing first conductive material pillars within the first contact openings, the first pillars having upper surfaces which are elevationally above the word lines;

providing a planarized base layer of insulating material over the planarized first layer of insulating material and first pillars, the planarized base layer having a planar uppermost region and a planar uppermost surface;

providing an intermediate layer of insulating material atop the uppermost region of the planarized base layer, the insulating material of the intermediate layer being different in composition from the insulating material of the uppermost region of the base layer with the insulating material of the intermediate layer being selectively etchable relative to the insulating material of such uppermost region;

providing capacitor contact openings through the intermediate layer to electrically connect with the first active regions;

providing a layer of conductive material over the intermediate layer of insulating material and within the capacitor contact openings, the layer of conductive material having an outer surface;

removing conductive material from atop the intermediate layer to define isolated cell storage node containers electrically connecting with the first active regions, the isolated cell storage node containers having internal sidewalls and external sidewalls;

etching the intermediate layer selectively relative to the isolated capacitor storage node and uppermost region of the base layer, and using the uppermost region of the base layer as an etch stop during such etching to expose only a portion of the external sidewalls of the isolated cell storage node containers;

providing a capacitor cell dielectric layer on the wafer atop the isolated storage nodes including the exposed portions of the isolated storage node external sidewalls, insulating material of the base layer being interposed between the first pillar upper surfaces and the capacitor cell dielectric layer;

providing a conductive capacitor cell layer atop the capacitor cell dielectric layer to define an array of memory cell capacitors;

providing an overlying layer of insulating material over the conductive capacitor cell layer;

providing bit line contact openings through the overlying layer, conductive capacitor cell layer, cell capacitor dielectric layer and base layer to the first pillar upper surfaces, the bit line contact openings having sidewalls, the bit line contact opening sidewalls including exposed edges of the conductive capacitor cell layer;

electrically insulating exposed edges of the conductive capacitor cell layer within the bit line contact openings; and after electrically insulating the exposed edges, providing a digit line layer of conductive material atop the wafer and within the bit line contact openings, the digit line layer electrically connecting with the first pillar upper surfaces.

13. The method of forming a bit line over capacitor array of memory cells of claim 12 wherein the uppermost region comprises nitride, and the intermediate layer comprises oxide.

14. The semiconductor processing method of forming a memory cell of claim 12 wherein the base layer of insulating material is not homogeneous, the uppermost region being formed of a different material from remaining portions of the base layer.

15. The method of forming a bit line over capacitor array of memory cells of claim 14 wherein the uppermost region of the base layer comprises nitride and the remaining portions of the base layer comprise oxide.

16. The method of forming a bit line over capacitor array of memory cells of claim 12 wherein the material of the first conductive pillars and the material of the conductive layer provided over the intermediate layer comprises conductively doped polysilicon.

17. The method of forming a bit line over capacitor array of memory cells of claim 12 wherein the material of the first conductive pillars and the material of the conductive layer provided over the intermediate layer comprises conductively doped polysilicon, and the method further comprising:

providing an electrically insulative nitride oxidation barrier layer atop the cell capacitor layer to a thickness of from about 150 Angstroms to about 1500 Angstroms prior to providing the overlying insulating layer, the step of electrically insulating the exposed edges comprising exposing the wafer to an oxidizing ambient to oxidize the cell polysilicon exposed edges, the nitride oxidation barrier layer during such oxidation exposure inhibiting oxidation of the outer surface of the cell polysilicon layer.

18. A method of forming a bit line over capacitor array of memory cells comprising:
  providing an array of substantially electrically isolated word lines atop a semiconductor wafer;
  providing active areas about the word lines to define an array of memory cell FETs, the active areas being defined by a first active region for electrical connection with a memory cell capacitor and a second active region for electrical connection with a bit line;
  providing a planarized first layer of an insulating material over the word lines and active areas, the planarized layer of insulating material having an upper surface which is above the word lines;
  providing first contact openings through the first layer of insulating material to second active regions;
  providing first conductive material pillars within the first contact openings, the first pillars having upper surfaces which are elevationally above the word lines;
  providing a planarized base layer of insulating material over the planarized first layer of insulating material and first pillars, the planarized base layer having a planar uppermost region, a planar uppermost surface, and a first thickness;
  providing an intermediate layer of insulating material atop the uppermost region of the planarized base layer, the insulating material of the intermediate layer being different in composition from the insulating material of the uppermost region of the base layer with the insulating material of the intermediate layer being selectively etchable relative to the insulating material of such uppermost region;
  providing capacitor contact openings through the intermediate layer to electrically connect with the first active regions;
  providing a layer of conductive material over the intermediate layer of insulating material and within the capacitor contact openings, the layer of conductive material having an outer surface;
  removing conductive material from atop the intermediate layer to define isolated cell storage node containers electrically connecting with the first active regions, the isolated cell storage node containers having internal sidewalls and external sidewalls;
  etching the intermediate layer selectively relative to the isolated capacitor storage node and uppermost region of the base layer, and using the uppermost region of the base layer as an etch stop during such etching to expose only a portion of the external sidewalls of the isolated cell storage node containers;
  providing a capacitor cell dielectric layer on the wafer atop the isolated storage nodes including the exposed portions of the isolated storage node external sidewalls, insulating material of the base layer being interposed between the first pillar upper surfaces and the capacitor cell dielectric layer;
  providing a conductive capacitor cell layer atop the capacitor cell dielectric layer to define an array of memory cell capacitors, individual memory cell capacitors of the array being defined by an outwardly projecting container structure having a projecting outermost surface;
  providing an overlying layer of insulating material over the conductive capacitor cell layer to a second thickness above the outermost surface, the second thickness being greater than the first thickness;
  providing preliminary bit line contact openings through the overlying layer, conductive capacitor cell layer, and cell capacitor dielectric layer over the first pillars, the preliminary bit line contact openings having sidewalls, the preliminary bit line contact opening sidewalls including exposed edges of the conductive capacitor cell layer;
  electrically insulating exposed edges of the conductive capacitor cell layer;
  blanket etching without photomasking the base layer and overlying layer to extend the preliminary bit line contact to the first pillar upper surfaces, and leaving insulating material of the overlying layer atop the projecting outermost surfaces; and
  after electrically insulating the exposed edges, providing a digit line layer of conductive material atop the wafer and within the bit line contact openings, the digit line layer electrically connecting with the first pillar upper surfaces.

19. The method of forming a bit line over capacitor array of memory cells of claim 18 wherein the uppermost region comprises nitride, and the intermediate layer comprises oxide.

20. The semiconductor processing method of forming a memory cell of claim 18 wherein the base layer of insulating material is not homogeneous, the uppermost region being formed of a different material from remaining portions of the base layer.

21. The method of forming a bit line over capacitor array of memory cells of claim 20 wherein the uppermost region of the base layer comprises nitride and the remaining portions of the base layer comprise oxide.

22. The method of forming a bit line over capacitor array of memory cells of claim 18 wherein the material of the first conductive pillars and the material of the conductive layer provided over the intermediate layer comprises conductively doped polysilicon.

23. The method of forming a bit line over capacitor array of memory cells of claim 18 wherein the material of the first conductive pillars and the material of the conductive layer provided over the intermediate layer comprises conductively doped polysilicon, and the method further comprising;
  providing an electrically insulative nitride oxidation barrier layer atop the cell capacitor layer to a thickness of from about 150 Angstroms to about 1500 Angstroms prior to providing the overlying insulating layer, the step of electrically insulating the exposed edges comprising exposing the wafer to an oxidizing ambient to oxidize the cell polysilicon exposed edges, the nitride oxidation barrier layer during such oxidation exposure inhibiting oxidation of the outer surface of the cell polysilicon layer.

24. A method of forming a bit line over capacitor array of memory cells comprising:
  providing an array of substantially electrically isolated word lines atop a semiconductor wafer;
  providing active areas about the word lines to define an array of memory cell FETs, the active areas being defined by a first active region for electrical connection with a memory cell capacitor and a second active region for electrical connection with a bit line;

providing a planarized first layer of an insulating material over the word lines and active areas, the planarized layer of insulating material having an upper surface which is above the word lines;

providing first contact openings through the first layer of insulating material to second active regions;

providing second contact openings through the first layer of insulating material to first active regions;

providing first conductive material pillars within the first contact openings, the first pillars having upper surfaces which are elevationally above the word lines;

providing second conductive material pillars within the second contact openings, the second pillars having upper surfaces which are elevationally above the word lines;

providing a covering layer of insulating material over the planarized first layer of insulating material and first and second pillars;

providing capacitor contact openings through the covering layer to the second pillar upper surfaces;

providing a layer of conductive material over the covering layer of insulating material and within the capacitor contact openings, the layer of conductive material having an outer surface;

removing conductive material from atop the covering layer to define isolated cell storage node containers electrically connecting with the first active regions;

providing a capacitor cell dielectric layer on the wafer atop the isolated storage nodes, insulating material of the covering layer being interposed between the first pillar upper surfaces and the capacitor cell dielectric layer;

providing a conductive capacitor cell layer atop the capacitor cell dielectric layer to define an array of memory cell capacitors;

providing an overlying layer of insulating material over the conductive capacitor cell layer;

providing bit line contact openings through the overlying layer, conductive capacitor cell layer, cell capacitor dielectric layer and covering layer to the first pillar upper surfaces, the bit line contact openings having sidewalls, the bit line contact opening sidewalls including exposed edges of the conductive capacitor cell layer;

electrically insulating exposed edges of the conductive capacitor cell layer within the bit line contact openings; and after electrically insulating the exposed edges, providing a digit line layer of conductive material atop the wafer and within the bit line contact openings, the digit line layer electrically connecting with the first pillar upper surfaces.

25. The method of forming a bit line over capacitor array of memory cells of claim 24 wherein the covering layer is not homogeneous.

26. The method of forming a bit line over capacitor array of memory cells of claim 24 wherein the material of the first conductive pillars and the material of the conductive layer provided over the covering layer comprises conductively doped polysilicon.

27. The method of forming a bit line over capacitor array of memory cells of claim 24 wherein the material of the first conductive pillars and the material of the conductive layer provided over the covering layer comprises conductively doped polysilicon, and the method further comprising:

providing an electrically insulative nitride oxidation barrier layer atop the cell capacitor layer to a thickness of from about 150 Angstroms to about 1500 Angstroms prior to providing the overlying insulating layer, the step of electrically insulating the exposed edges comprising exposing the wafer to an oxidizing ambient to oxidize the cell polysilicon exposed edges, the nitride oxidation barrier layer during such oxidation exposure inhibiting oxidation of the outer surface of the cell polysilicon layer.

28. The method of forming a bit line over capacitor array of memory cells of claim 24 wherein the step of providing a covering layer of insulating material comprises:

providing a planarized base layer of insulating material over the planarized first layer of insulating material and the first and second pillars, the planarized base layer having a planar uppermost region and a planar uppermost surface; and providing an intermediate layer of insulating material atop the uppermost region of the planarized base layer, the insulating material of the intermediate layer being different in composition from the insulating material of the uppermost region of the base layer with the insulating material of the intermediate layer being selectively etchable relative to the insulating material of such uppermost region.

29. The method of forming a bit line over capacitor array of memory cells of claim 28 wherein the uppermost region comprises nitride, and the intermediate layer comprises oxide.

30. The semiconductor processing method of forming a memory cell of claim 28 wherein the base layer of insulating material is not homogeneous, the uppermost region being formed of a different material from remaining portions of the base layer.

31. The method of forming a bit line over capacitor array of memory cells of claim 28 wherein, individual memory cell capacitors of the array are defined by an outwardly projecting container structure having a projecting outermost surface;

the planarized base layer is provided to a first thickness and the overlying layer is provided to a second thickness above an outermost projecting surface of the container, the second thickness being greater than the first thickness; and the step of providing bit line contact openings comprises:

providing preliminary bit line contact openings through the overlying layer, conductive capacitor cell layer, and cell capacitor dielectric layer over the first pillars, the preliminary bit line contact openings having sidewalls, the preliminary bit line contact opening sidewalls including the exposed edges of the conductive capacitor cell layer; and blanket etching without photomasking the base layer and overlying layer to extend the preliminary bit line contact to the first pillar upper surfaces, and leaving insulating material of the overlying layer atop the projecting outermost surfaces.

32. The method of forming a bit line over capacitor array of memory cells of claim 31 wherein the uppermost region comprises nitride, and the intermediate layer comprises oxide.

33. The semiconductor processing method of forming a memory cell of claim 31 wherein the base layer of insulating material is not homogeneous, the uppermost region being formed of a different material from remaining portions of the base layer.

* * * * *